(12) United States Patent
Nagao

(10) Patent No.: US 11,514,984 B2
(45) Date of Patent: Nov. 29, 2022

(54) SEMICONDUCTOR MEMORY DEVICE EXECUTING PROGRAM OPERATION

(71) Applicant: Kioxia Corporation, Tokyo (JP)

(72) Inventor: Osamu Nagao, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 120 days.

(21) Appl. No.: 17/017,738

(22) Filed: Sep. 11, 2020

(65) Prior Publication Data
US 2021/0090642 A1 Mar. 25, 2021

(30) Foreign Application Priority Data
Sep. 19, 2019 (JP) .............................. JP2019-170348

(51) Int. Cl.
| | |
|---|---|
| *G11C 16/34* | (2006.01) |
| *G11C 11/56* | (2006.01) |
| *G11C 16/10* | (2006.01) |
| *G11C 16/04* | (2006.01) |

(52) U.S. Cl.
CPC ...... *G11C 11/5628* (2013.01); *G11C 11/5671* (2013.01); *G11C 16/0483* (2013.01); *G11C 16/10* (2013.01); *G11C 16/3459* (2013.01)

(58) Field of Classification Search
CPC ..... G11C 16/0483; G11C 16/10; G11C 16/24; G11C 16/26; G11C 16/3459
USPC ...................................... 365/185.17, 185.03
See application file for complete search history.

(56) References Cited

U.S. PATENT DOCUMENTS

| | | | |
|---|---|---|---|
| 7,688,638 B2 | 3/2010 | Hemink | |
| 9,672,926 B2 | 6/2017 | Shiino et al. | |
| 10,249,377 B2 | 4/2019 | Kasai et al. | |
| 2020/0185047 A1* | 6/2020 | Lee | ........................ G11C 16/24 |

FOREIGN PATENT DOCUMENTS

| | | |
|---|---|---|
| JP | 2006185483 A | 7/2006 |
| JP | 2014225310 A | 12/2014 |

OTHER PUBLICATIONS

U.S. Appl. No. 16/775,151; First Named Inventor: Osamu Nagao; Title: "Semiconductor Memory Device"; filed Jan. 28, 2020.

* cited by examiner

*Primary Examiner* — Alfredo Bermudez Lozada
(74) *Attorney, Agent, or Firm* — Holtz, Holtz & Volek PC

(57) ABSTRACT

A semiconductor memory device comprises a first word line coupled to first and second memory cell transistors, first and second bit lines, and a controller. In a first program loop, a controller applies a first voltage to first and second bit lines in a program operation, and classifies the first and second memory cell transistors into first and second groups by applying a first verify voltage to the first word line in a verify operation. In a program operation of each of program loops that are executed after the first program loop, the controller applies the first voltage to the first bit line when a verification of the first memory cell transistor has not been passed, and applies a second voltage to the second bit line when a verification of the second memory cell transistor has not been passed.

20 Claims, 19 Drawing Sheets

BL voltages under programming (first embodiment)

(1) First program

| | Write state | | |
|---|---|---|---|
| | "A","B" | "C","D","E" | "F","G" |
| First group | VSS | VSS | VSS |

(2) Program after first classification read

| | Write state | | |
|---|---|---|---|
| | "A","B" | "C","D","E" | "F","G" |
| First group | VSS | VSS | VSS |
| Second group | VCH | VSS | VSS |

(3) Program after second classification read

| | Write state | | |
|---|---|---|---|
| | "A","B" | "C","D","E" | "F","G" |
| First group | VSS | – | – |
| Second group | VCH | – | – |
| Third group | – | VSS | VSS |
| Fourth group | – | VCH | VSS |

(4) Program after third classification read

| | Write state | | |
|---|---|---|---|
| | "A","B" | "C","D","E" | "F","G" |
| First group | VSS | – | – |
| Second group | VCH | – | – |
| Third group | – | VSS | – |
| Fourth group | – | VCH | – |
| Fifth group | – | – | VSS |
| Sixth group | – | – | VCH |

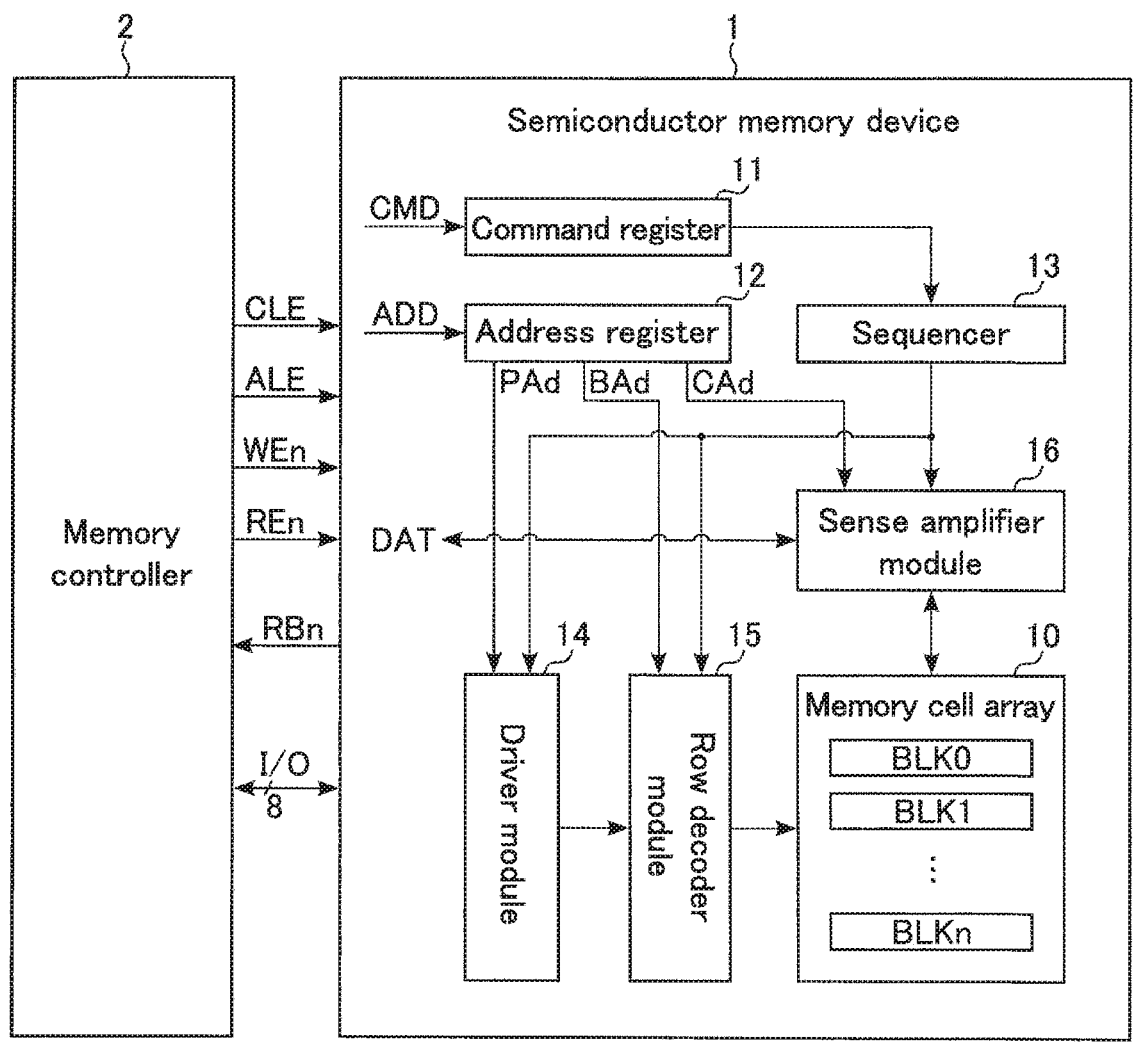
F I G. 1

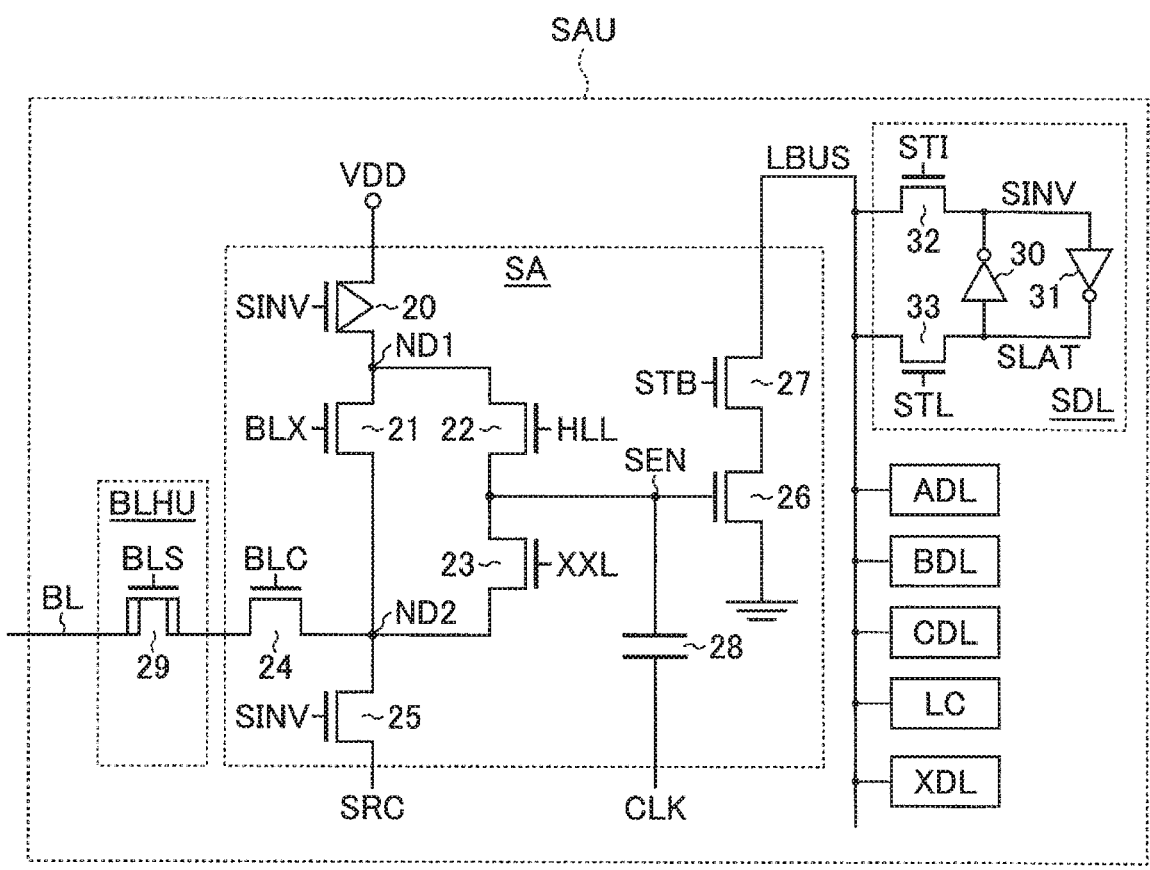
F I G. 5

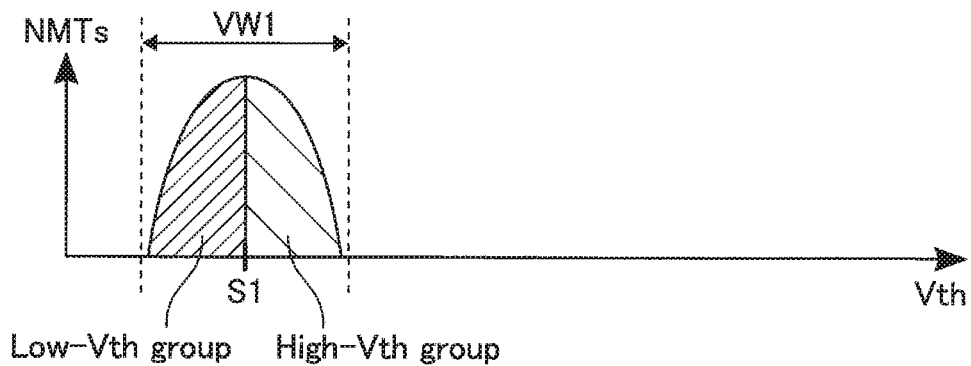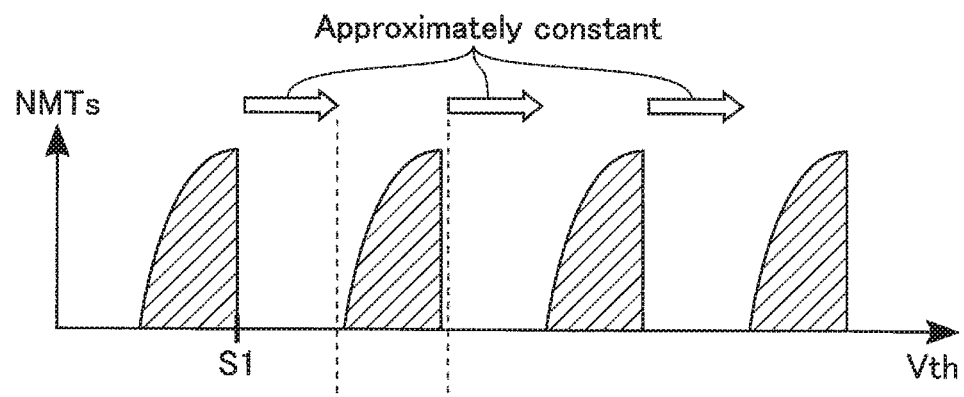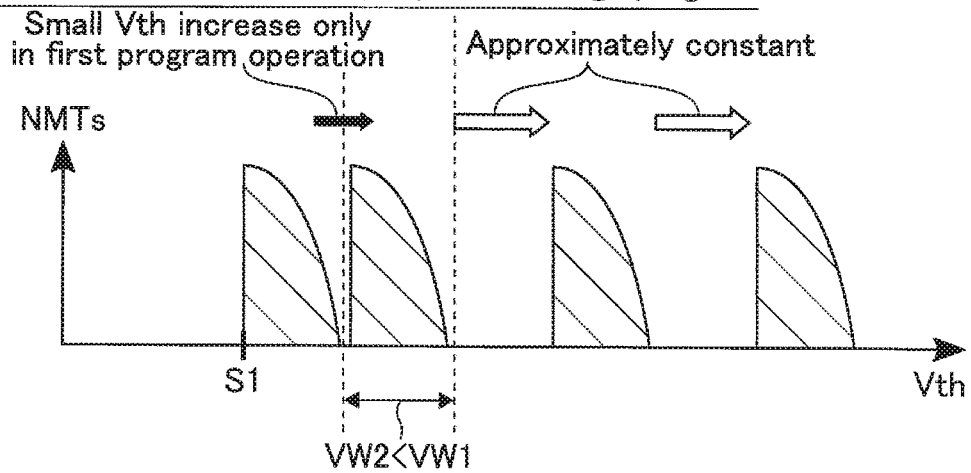
FIG. 8

BL voltages under programming (first embodiment)

(1) First program

|  | Write state | | |
|---|---|---|---|
|  | "A","B" | "C","D","E" | "F","G" |
| First group | VSS | VSS | VSS |

(2) Program after first classification read

|  | Write state | | |
|---|---|---|---|
|  | "A","B" | "C","D","E" | "F","G" |
| First group | VSS | VSS | VSS |
| Second group | VCH | VSS | VSS |

(3) Program after second classification read

|  | Write state | | |
|---|---|---|---|
|  | "A","B" | "C","D","E" | "F","G" |
| First group | VSS | — | — |
| Second group | VCH | — | — |
| Third group | — | VSS | VSS |
| Fourth group | — | VCH | VSS |

(4) Program after third classification read

|  | Write state | | |
|---|---|---|---|
|  | "A","B" | "C","D","E" | "F","G" |
| First group | VSS | — | — |
| Second group | VCH | — | — |
| Third group | — | VSS | — |
| Fourth group | — | VCH | — |
| Fifth group | — | — | VSS |
| Sixth group | — | — | VCH |

F I G. 10

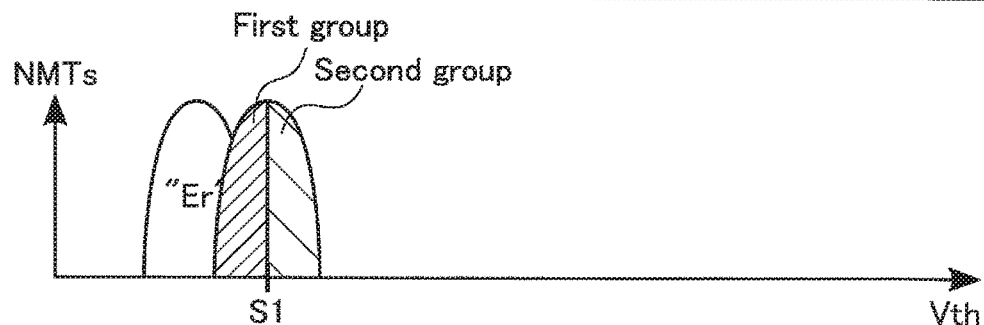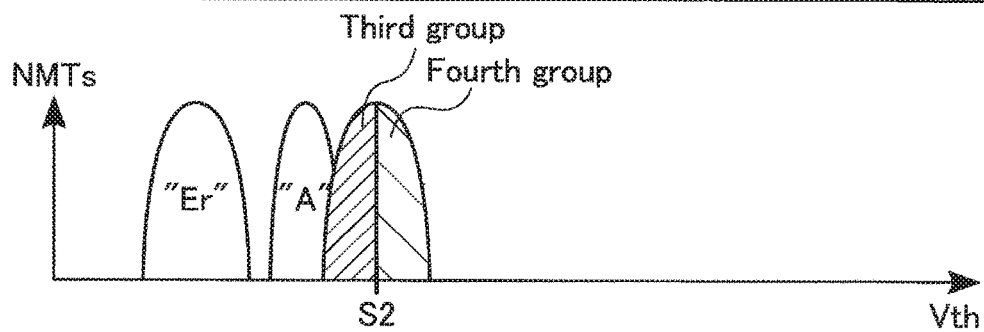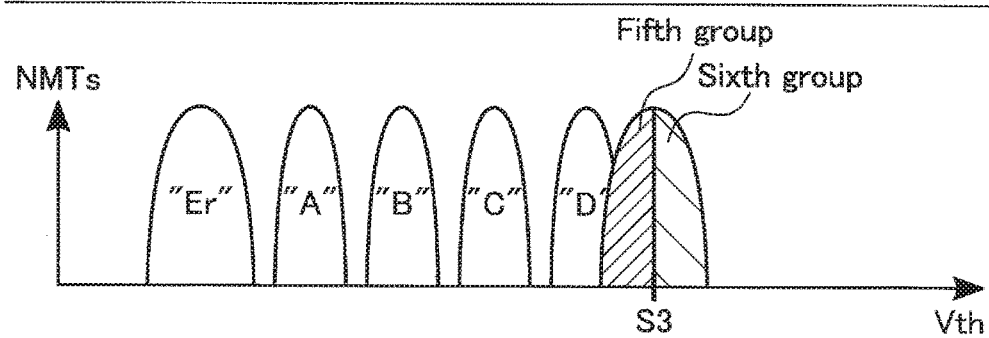
FIG. 11

Example of verification targets (first comparative example)

| Verification target | Program loop number ||||||||||||||||
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| "A" state | ○ | ○ | ○ | ○ | ○ | | | | | | | | | | | |
| "B" state | | ○ | ○ | ○ | ○ | ○ | | | | | | | | | | |
| "C" state | | | | ○ | ○ | ○ | ○ | ○ | | | | | | | | |
| "D" state | | | | | | ○ | ○ | ○ | ○ | ○ | | | | | | |
| "E" state | | | | | | | | ○ | ○ | ○ | ○ | ○ | | | | |
| "F" state | | | | | | | | | ○ | ○ | ○ | ○ | ○ | | | |
| "G" state | | | | | | | | | | | ○ | ○ | ○ | ○ | ○ | ○ |

Example of verification targets (second comparative example)

| Verification target | Program loop number | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| Classification read | ○ | | | | | | | | | | | | | | | | | |
| "A" state | | | ○ | ○ | ○ | | | | | | | | | | | | | |
| "B" state | | | | ○ | ○ | ○ | | | | | | | | | | | | |
| "C" state | | | | | | ○ | ○ | ○ | ○ | | | | | | | | | |
| "D" state | | | | | | | | ○ | ○ | ○ | ○ | | | | | | | |
| "E" state | | | | | | | | | | ○ | ○ | ○ | ○ | | | | | |
| "F" state | | | | | | | | | | | ○ | ○ | ○ | ○ | ○ | | | |
| "G" state | | | | | | | | | | | | ○ | ○ | ○ | ○ | ○ | ○ | ○ |

Verification that can be omitted
Added verification

FIG. 14

Example of verification targets (first embodiment)

| Verification target | Program loop number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Classification read | ○ | | | | | | | | | | | | | | | |
| "A" state | | | ○ | ○ | ○ | | | | | | | | | | | |
| "B" state | | | | ○ | ○ | ○ | | | | | | | | | | |
| "C" state | | | | | ○ | ○ | ○ | ○ | | | | | | | | |
| "D" state | | | | | | | ○ | ○ | ○ | ○ | | | | | | |
| "E" state | | | | | | | | ○ | ○ | ○ | ○ | | | | | |
| "F" state | | | | | | | | | | ○ | ○ | ○ | ○ | | | |
| "G" state | | | | | | | | | | | ○ | ○ | ○ | ○ | | |

Verification omitted

FIG. 15

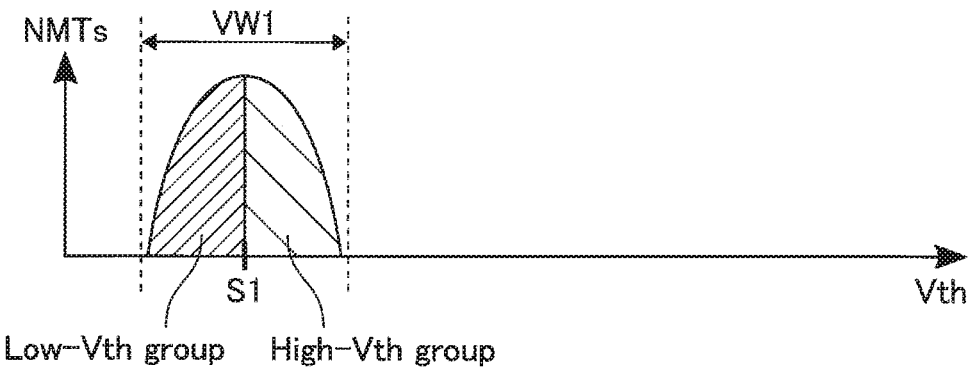
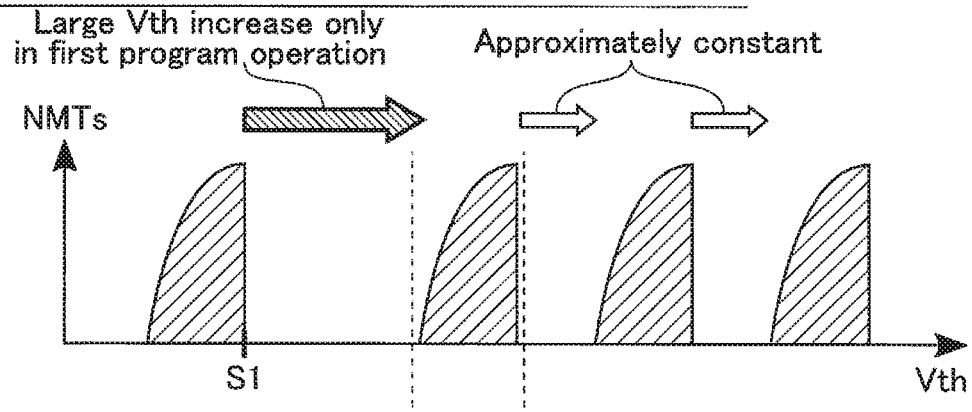
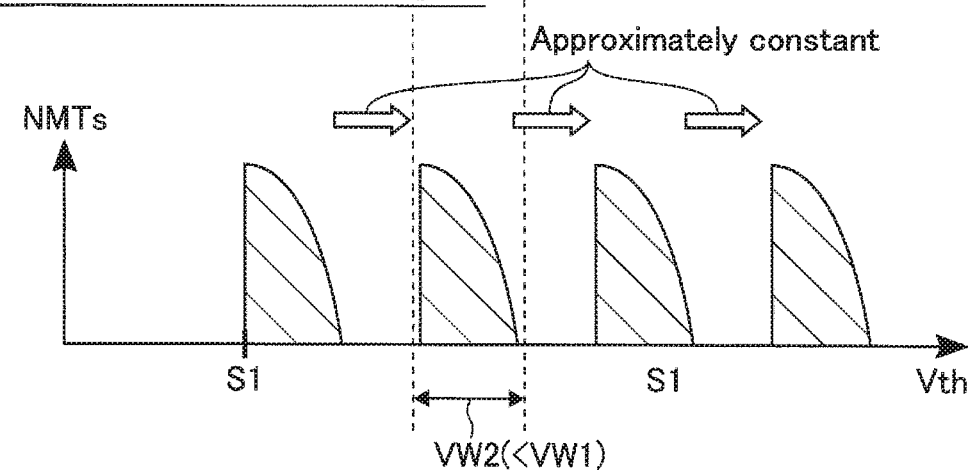
FIG. 16

BL voltages under programming (second embodiment)

(1) First program

|  | Write state | | |
|---|---|---|---|
|  | "A","B" | "C","D","E" | "F","G" |
| First group | VSS | VSS | VSS |

(2) Program after first classification read

|  | Write state | | |
|---|---|---|---|
|  | "A","B" | "C","D","E" | "F","G" |
| First group | VSS | VCH | VCH |
| Second group | VCH | VCH | VCH |

(3) Program after second classification read

|  | Write state | | |
|---|---|---|---|
|  | "A","B" | "C","D","E" | "F","G" |
| First group | VSS | – | – |
| Second group | VCH | – | – |
| Third group | – | VSS | VCH |
| Fourth group | – | VCH | VCH |

(4) Program after third classification read

|  | Write state | | |
|---|---|---|---|
|  | "A","B" | "C","D","E" | "F","G" |
| First group | VSS | – | – |
| Second group | VCH | – | – |
| Third group | – | VSS | – |
| Fourth group | – | VCH | – |
| Fifth group | – | – | VSS |
| Sixth group | – | – | VCH |

F I G. 17

Example of verification targets (second embodiment)

| Verification target | Program loop number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Classification read | ○ | | | | | | | | | | | | | | | |
| "A" state | | ○ | ○ | ○ | ▨ | ▨ | | | | | | | | | | |
| "B" state | | | ○ | ○ | ○ | ▨ | ▨ | | | | | | | | | |
| "C" state | | | | | ○ | ○ | ○ | ○ | ▨ | ▨ | | | | | | |
| "D" state | | | | | | ○ | ○ | ○ | ○ | ▨ | ▨ | ▨ | | | | |
| "E" state | | | | | | | | | ○ | ○ | ○ | ○ | ▨ | ▨ | | |
| "F" state | | | | | | | | | | ○ | ○ | ○ | ○ | ▨ | ▨ | |
| "G" state | | | | | | | | | | | ○ | ○ | ○ | ○ | ▨ | |

Verification omitted

F I G. 18

SEMICONDUCTOR MEMORY DEVICE EXECUTING PROGRAM OPERATION

CROSS-REFERENCE TO RELATED APPLICATIONS

This application is based upon and claims the benefit of priority from Japanese Patent Application No. 2019-170348, filed Sep. 19, 2019, the entire contents of which are incorporated herein by reference.

FIELD

Embodiments described herein relate generally to a semiconductor memory device.

BACKGROUND

A NAND flash memory, which can nonvolatilely store data, is known.

BRIEF DESCRIPTION OF THE DRAWINGS

FIG. 1 is a block diagram showing a configuration example of a semiconductor memory device according to a first embodiment.

FIG. 5 is a circuit diagram showing an example of the circuit configuration of a sense amplifier unit included in the semiconductor memory device according to the first embodiment.

FIG. 8 is a threshold voltage distribution diagram showing an example of changes in threshold voltage distribution of memory cell transistors in a write operation of a state.

FIG. 10 is a table showing an example of voltages applied to bit lines in a program operation of the semiconductor memory device according to the first embodiment.

FIG. 11 is a threshold voltage distribution diagram showing an example of changes in the threshold voltages of memory cell transistors in the write operation of the semiconductor memory device according to the first embodiment.

FIG. 14 is a table showing an example of states set as verification objects in a write operation of a semiconductor memory device according to a second comparative example.

FIG. 15 is a table showing an example of states set as verification objects in the write operation of the semiconductor memory device according to the first embodiment.

FIG. 16 is a threshold voltage distribution diagram showing an example of changes in the threshold voltage distribution of memory cell transistors caused by a program operation after a classification read in the write operation of a semiconductor memory device according to a second embodiment.

FIG. 17 is a table showing an example of voltages applied to bit lines in a program operation of the semiconductor memory device according to the second embodiment.

FIG. 18 is a table showing an example of states set as verification objects in the write operation of the semiconductor memory device according to the second embodiment.

DETAILED DESCRIPTION

Figure 2:
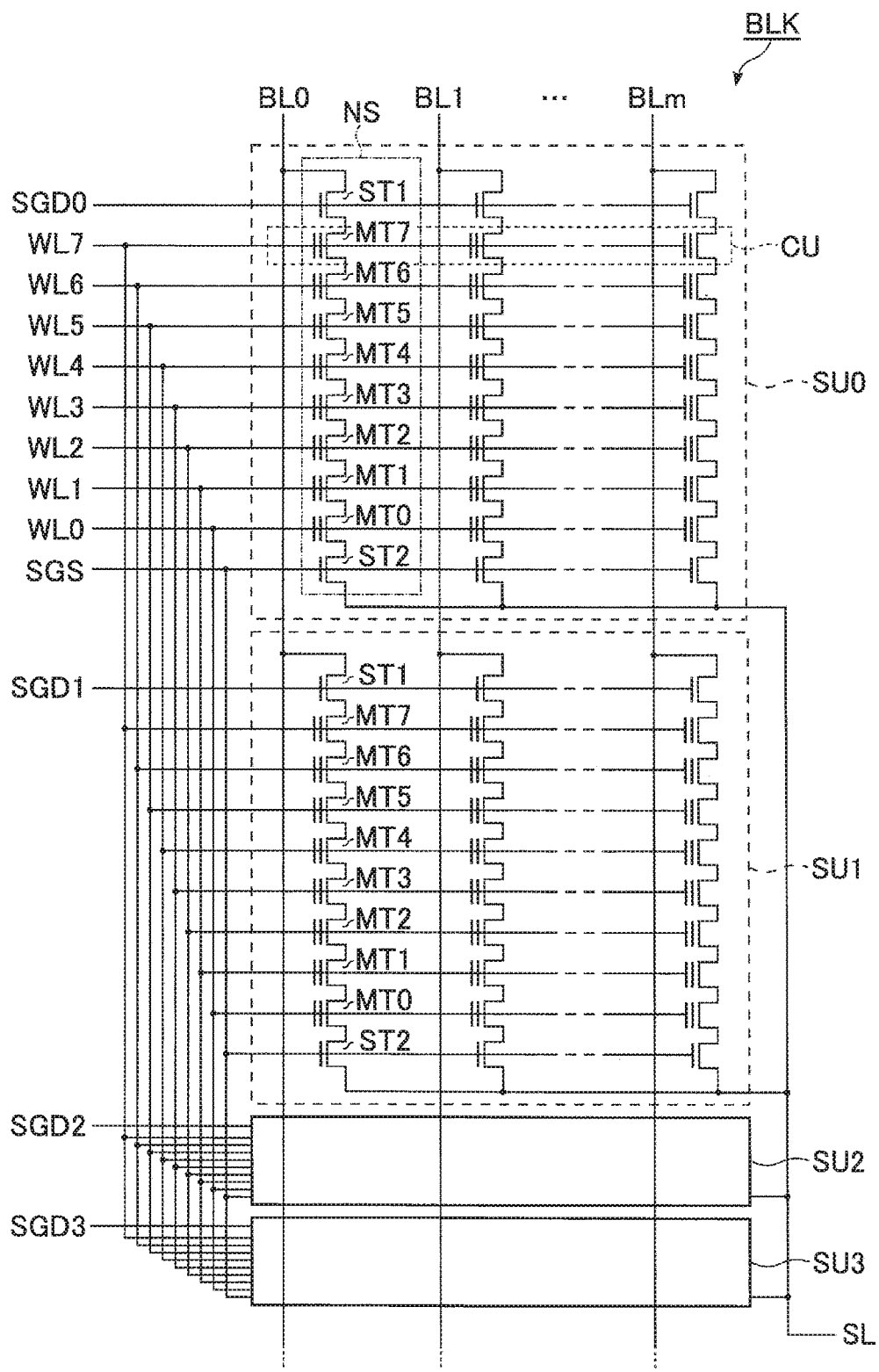
FIG. 2 is a circuit diagram showing an example of the circuit configuration of a memory cell array included in the semiconductor memory device according to the first embodiment.

A semiconductor memory device comprises first to fourth memory cell transistors, a first word line, first to fourth bit lines, and a controller. The first to fourth memory cell transistors are each configured to store first data when having a first threshold voltage and to store second data which is different from the first data when having a second threshold voltage which is higher than the first threshold voltage. The first word line is coupled to the first to fourth memory cell transistors. The first bit line is coupled to the first memory cell transistor. The second bit line is coupled to the second memory cell transistor. The third bit line is coupled to the third memory cell transistor. The fourth bit line is coupled to the fourth memory cell transistor. The controller is configured to execute a write operation. In the write operation, the controller executes multiple program loops including a first program loop and a second program loop after the first program loop, each including a program operation and a verify operation. In the write operation, the controller causes each of the first memory cell transistor and the second memory cell transistor to store the first data and each of the third memory cell transistor and the fourth memory cell transistor to store the second data. In the program operation of the first program loop, the controller applies a first voltage to each of the first to fourth bit lines when applying a program voltage to the first word line. In the verify operation of the first program loop, the controller classifies the first and second memory cell transistors into a first group of memory cell transistors each having a low threshold voltages and a second group of memory cell transistors each having a high threshold voltages by applying a first verify voltage to the first word line. In the program operation of each of a plurality of program loops that are executed after the first program loop and before the second program loop, when applying a stepped-up program voltage to the first word line, the controller applies the first voltage to the first bit line when a verification of the first memory cell transistor included in the first group has not been passed, and applies a second voltage which is different from the first voltage to the second bit line when a verification of the second memory cell transistor included in the second group has not been passed. In the program operation of the second program loop, when applying a stepped-up program voltage to the first word line, the controller applies the first voltage to each of the third and fourth bit lines. In the verify operation of the second program loop, the controller classifies the third and fourth memory cell transistors into a third group of memory cell transistors each having a low threshold voltages and a fourth group of memory cell transistors each having a high threshold voltages by applying a second verify voltage which is higher than the first verify voltage to the first word line. In the program operation of each of a plurality of program loops that are executed after the second program loop, when applying a stepped-up program voltage to the first word line. The controller applies the first voltage to the third bit line when a verification of the third memory cell transistor included in the third group has not been passed, and applies the second voltage to the fourth bit line when a verification of the fourth memory cell transistor included in the fourth group has not been passed.

Hereinafter, embodiments will be described with reference to the accompanying drawings. Each of the embodiments is an example of an apparatus or method that embodies a technical idea of the embodiment. The drawings are schematic or conceptual, and the dimensions, ratios, etc. in the drawings are not always the same as the actual ones. The technical idea of the embodiments is not specified by the shapes, structures, arrangements, etc. of the constituent elements.

In the following description, constituent elements having substantially the same function and configuration will be assigned with the same reference symbol. A numeral following letters constituting a reference symbol is used for distinction between elements referred to by reference symbols including the same letters and having the same configuration. If elements represented by reference symbols including the same letters need not be distinguished, those elements are assigned with reference symbols including only the letters.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to the first embodiment. The semiconductor memory device 1 is a NAND flash memory, which can nonvolatilely store data, and can be controlled by an external memory controller 2. As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer larger than or equal to 1). Each block BLK includes a set of memory cell transistors that can nonvolatilely store data, and is used as, for example, a data erase unit. A plurality of bit lines and a plurality of word lines are provided in the memory cell array 10. Each memory cell is associated with, for example, one bit line and one word line. A detailed configuration of the memory cell array 10 will be described later.

The command register 11 stores a command CMD received by the semiconductor memory device 1 from the memory controller 2. The command CMD includes, for example, an instruction to cause the sequencer 13 to execute a read operation, a write operation, an erase operation, or the like.

The address register 12 retains address information ADD received by the semiconductor memory device 1 from the memory controller 2. The address information ADD includes, for example, a block address BAd, a page address PAd, and a column address CAd. For example, the block address BAd, page address PAd, and column address CAd are used to select a block BLK, word line, and bit line, respectively.

The sequencer 13 controls the overall operation of the semiconductor memory device 1. For example, the sequencer 13 controls the driver module 14, the row decoder module 15, the sense amplifier module 16, or the like based on the command CMD retained in the command register 11, to execute a read operation, a write operation, an erase operation, or the like.

The driver module 14 generates a voltage used in a read operation, a write operation, an erase operation, or the like. Then, the driver module 14 applies the generated voltage to a signal line corresponding to a selected word line based on, for example, the page address PAd retained in the address register 12.

Based on the block address BAd retained in the address register 12, the row decoder module 15 selects one corresponding block BLK in the memory cell array 10. Then, the row decoder module 15 transfers, for example, the voltage applied to the signal line corresponding to the selected word line to the selected word line in the selected block BLK.

In a write operation, the sense amplifier module 16 applies, to each bit line BL, a voltage determined in accordance with write data DAT received from the memory controller 2. In a read operation, the sense amplifier module 16 determines data stored in a memory cell based on the voltage of the corresponding bit line, and transfers the determination result to the memory controller 2 as read data DAT.

Communication between the semiconductor memory device 1 and the memory controller 2 is based on, for example, a NAND interface standard. For the communication between the semiconductor memory device 1 and the memory controller 2, a command latch enable signal CLE, an address latch enable signal ALE, a write enable signal WEn, a read enable signal REn, a ready/busy signal RBn, and an input/output signal I/O are used, for example.

The command latch enable signal CLE is a signal indicating that the input/output signal I/O received by the semiconductor memory device 1 is a command CMD. The address latch enable signal ALE is a signal indicating that the input/output signal I/O received by the semiconductor memory device 1 is address information ADD. The write enable signal WEn is a signal instructing the semiconductor memory device 1 to input an input/output signal I/O therein. The read enable signal REn is a signal instructing the semiconductor memory device 1 to output an input/output signal I/O therefrom. The ready/busy signal RBn is a signal notifying the memory controller 2 of whether the semiconductor memory device 1 is in a ready state or in a busy state. The ready state is a state in which the semiconductor memory device 1 accepts an order, whereas the busy state is a state in which the semiconductor memory device 1 does not accept an instruction. The input/output signal I/O is, for example, an 8-bit signal, and may include a command CMD, address information ADD, data DAT, and the like.

The above-described semiconductor memory device 1 and memory controller 2 may constitute a single semiconductor device in combination. Examples of such a semiconductor device include a memory card, such as an SD™ card, and a solid state drive (SSD).

[1-1-2] Circuit Configuration of Semiconductor Memory Device 1

(Circuit Configuration of Memory Cell Array 10)

FIG. 2 shows an example of the circuit configuration of the memory cell array 10 included in the semiconductor memory device 1 according to the embodiment while taking one of a plurality of blocks BLK included in the memory cell array 10 as an example. As shown in FIG. 2, the block BLK includes, for example, four string units SU0 to SU3.

Each string unit SU includes a plurality of NAND strings NS that are respectively associated with bit lines BL0 to BLm (where m is an integer larger than or equal to 1). Each NAND string NS includes, for example, memory cell transistors MT0 to MT7 and select transistors ST1 and ST2. Each memory cell transistor MT includes a control gate and a charge storage layer, and nonvolatilely stores data. Each of the select transistors ST1 and ST2 is used to select a string unit SU in various operations.

In each NAND string NS, the memory cell transistors MT0 to MT7 are coupled in series. The drain of the select transistor ST1 is coupled to an associated bit line BL, and the source of the select transistor ST1 is coupled to one end of the memory cell transistors MT0 to MT7 coupled in series. The drain of the select transistor ST2 is coupled to the other end of the memory cell transistors MT0 to MT7 coupled in series. The source of the select transistor ST2 is coupled to a source line CELSRC.

The control gates of the memory cell transistors MT0 to MT7 in the same block BLK are coupled in common to respective word lines WL0 to WL7. The gates of the select transistors ST1 in the string units SU0 to SU3 are coupled in common to respective select gate lines SGD0 to SGD3. The gates of the select transistors ST2 in the same block BLK are coupled in common to a select gate line SGS.

In the above-described circuit configuration of the memory cell array 10, a bit line BL is shared by the NAND strings NS to which the same column address is assigned in the respective string units SU. The source line CELSRC is, for example, shared by a plurality of blocks BLK.

A set of memory cell transistors MT coupled to a common word line WL in one string unit SU is referred to as, for example, a cell unit CU. For example, the storage capacity of the cell unit CU constituted by memory cell transistors MT each configured to store 1-bit data is defined as "1-page data". The cell unit CU may have a storage capacity of 2 or more-page data, according to the number of bits of data stored in each of the memory cell transistors MT.

The circuit configuration of the memory cell array 10 included in the semiconductor memory device 1 according to the first embodiment is not limited to the above-described one. The number of string units SU included in each block BLK and the numbers of memory cell transistors MT and select transistors ST1 and ST2 included in each NAND string NS may be any numbers.

(Circuit Configuration of Row Decoder Module 15)

Figure 3:
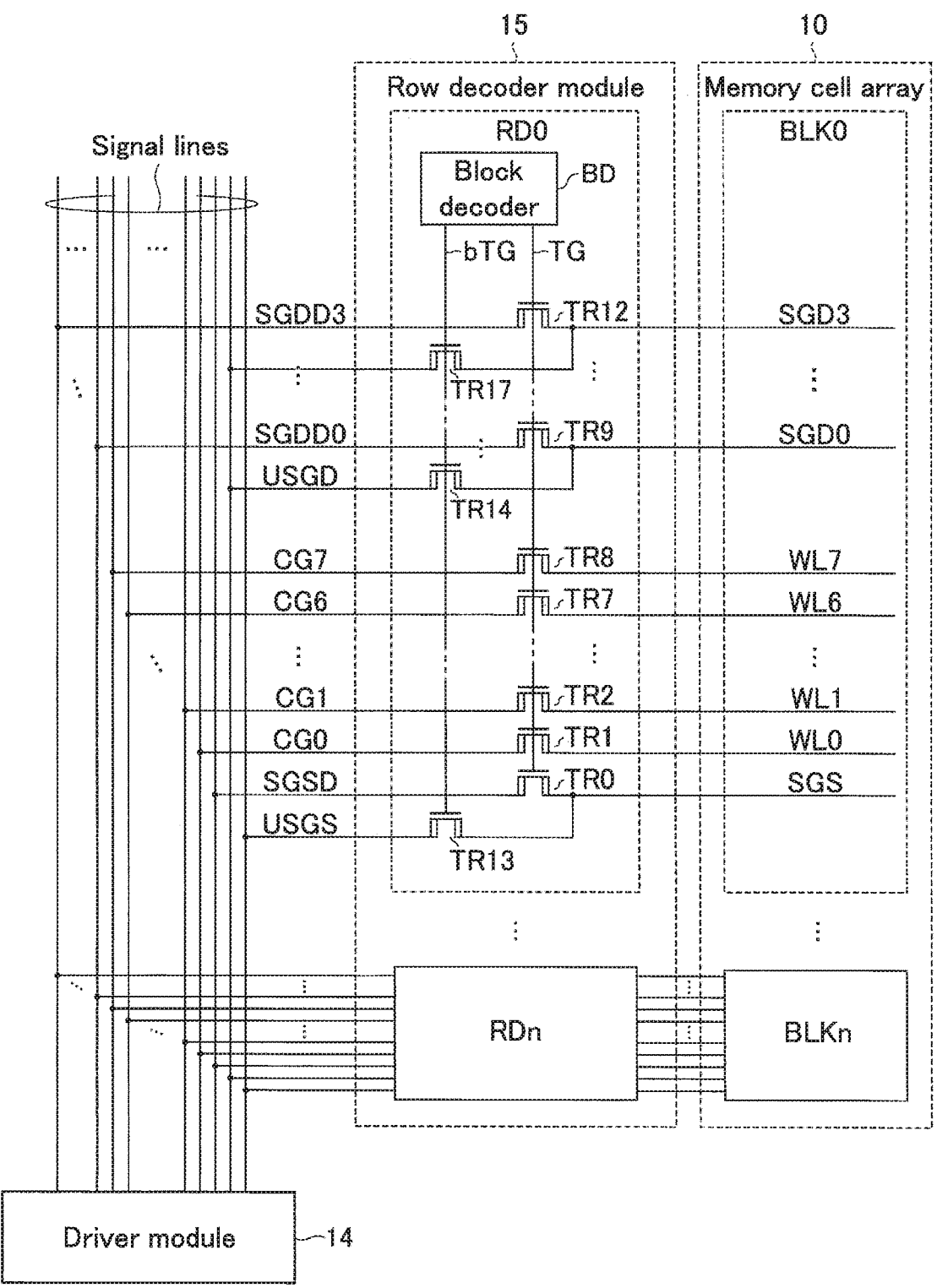
FIG. 3 is a circuit diagram showing an example of the circuit configuration of a row decoder module included in the semiconductor memory device according to the first embodiment.

FIG. 3 shows an example of the circuit configuration of the row decoder module 15 included in the semiconductor memory device 1 according to the first embodiment. As shown in FIG. 3, the row decoder module 15 includes, for example, row decoders RD0 to RDn, and is coupled to the driver module 14 via signal lines CG0 to CG7, SGDD0 to SGDD3, SGSD, USGD, and USGS.

The circuit configuration of the row decoder RD will be described in detail with the row decoder RD0 corresponding to the block BLK0 in focus. The row decoder RD includes, for example, a block decoder BD, transfer gate lines TG and bTG, and transistors TR0 to TR17.

The block decoder BD decodes the block address BAd. The block decoder BD then applies a predetermined voltage to each of the transfer gate lines TG and bTG, based on the decoding result. The voltage applied to the transfer gate line TG is complementary to the voltage applied to the transfer gate line bTG. In other words, an inversion signal of the signal input to the transfer gate line TG is input to the transfer gate line bTG.

Each of the transistors TR0 to TR17 is a high breakdown voltage N-channel MOS transistor. The gates of the transistors TR0 to TR12 are coupled in common to the transfer gate line TG. The gates of the transistors TR13 to TR17 are coupled in common to the transfer gate line bTG. Each transistor TR is coupled between a signal line extending from the driver module 14 and a line provided in the corresponding block BLK.

Specifically, the drain of the transistor TR0 is coupled to the signal line SGSD. The source of the transistor TR0 is coupled to the select gate line SGS. The drains of the transistors TR1 to TR8 are coupled to the signal lines CG0 to CG7, respectively. The sources of the transistors TR1 to TR8 are coupled to the word lines WL0 to WL7, respectively. The drains of the transistors TR9 to TR12 are coupled to the signal lines SGDD0 to SGDD3, respectively. The sources of the transistors TR9 to TR12 are coupled to the select gate lines SGD0 to SGD3, respectively. The drain of the transistor TR13 is coupled to the signal line USGS. The source of the transistor TR13 is coupled to the select gate line SGS. The drains of the transistors TR14 to TR17 are coupled in common to the signal line USGD. The sources of the transistors TR14 to TR17 are coupled to the select gate lines SGD0 to SGD3, respectively.

Namely, the signal lines CG0 to CG7 are used as global word lines shared by a plurality of blocks BLK, and the word lines WL0 to WL7 are used as local word lines provided for each block. The signal lines SGDD0 to SGDD3 and SGSD are used as global transfer gate lines shared by a plurality of blocks BLK, and the select gate lines SGD0 to SGD3 and SGS are used as local select gate lines provided for each block.

With the above-described configuration, the row decoder module 15 can select a block BLK. Specifically, in various operations, the block decoder BD corresponding to a selected block BLK applies "H" level and "L" level voltages to the transfer gate lines TG and bTG, respectively, and the block decoder BD corresponding to a non-selected block BLK applies "L" level and "H" level voltages to the transfer gate lines TG and bTG, respectively.

The above-described circuit configuration of the row decoder module 15 is merely an example, and may be changed as appropriate. For example, the number of transistors TR included in the row decoder module 15 may be a number based on the number of lines provided in each block BLK.

(Configuration of Sense Amplifier Module 16)

Figure 4:
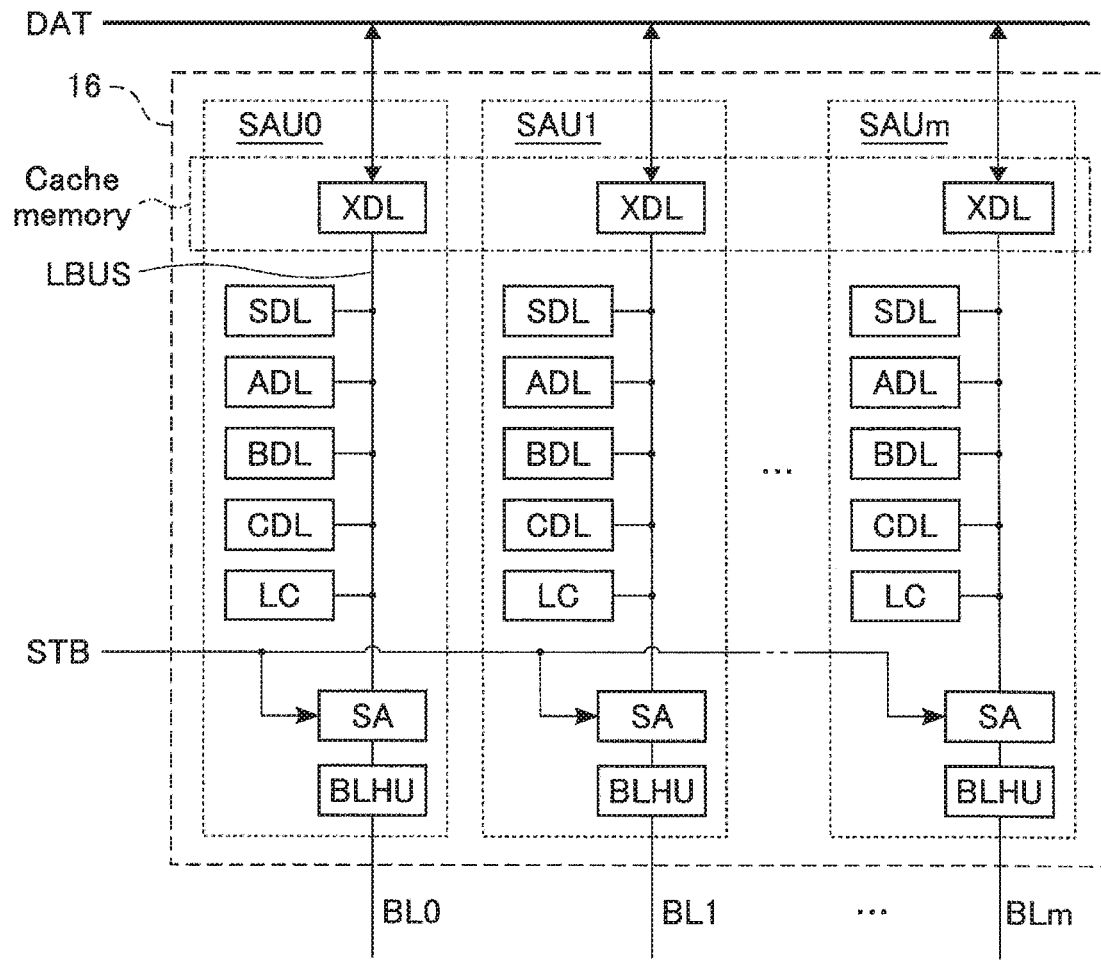
FIG. 4 is a circuit diagram showing an example of the circuit configuration of a sense amplifier module included in the semiconductor memory device according to the first embodiment.

FIG. 4 shows an example of the circuit configuration of the sense amplifier module 16 included in the semiconductor memory device 1 according to the first embodiment. As shown in FIG. 4, each sense amplifier unit SAU includes, for example, a bit line coupling section BLHU, a sense amplifier SA, a logic circuit LC, and latch circuits SDL, ADL, BDL, CDL, and XDL.

The bit line coupling section BLHU includes a high breakdown voltage transistor coupled between an associated bit line BL and sense amplifier SA. The sense amplifier SA, logic circuit LC, and latch circuits SDL, ADL, BDL, CDL, and XDL are coupled in common to a bus LBUS. The latch circuits SDL, ADL, BDL, CDL, and XDL can transmit and receive data therebetween.

A control signal STB generated by the sequencer 13 for example is input to each sense amplifier SA. The sense amplifier SA determines whether data read out to the associated bit line BL is "0" or "1", based on the timing of assertion of the control signal STB. Namely, the sense amplifier SA determines data stored in the selected memory cell based on the voltage of the bit line BL.

The logic circuit LC executes various logical operations using data retained in the latch circuits SDL, ADL, BDL, CDL, and XDL coupled to the common bus LBUS. Specifically, the logic circuit LC can execute an AND operation, an OR operation, a NAND operation, a NOR operation, an EXNOR operation, and the like based on data retained in two latch circuits.

Each of the latch circuits SDL, ADL, BDL, CDL, and XDL temporarily retains data. The latch circuit XDL is used for input and output of data DAT between the sense amplifier unit SAU and an input/output circuit of the semiconductor memory device 1. The latch circuit XDL may also be used as, for example, a cache memory of the semiconductor memory device 1. The semiconductor memory device 1 can be in a-ready state when at least the latch XDL is available.

FIG. 5 shows an example of the circuit configuration of the sense amplifier unit SAU in the semiconductor memory device 1 according to the first embodiment. As shown in FIG. 5, the sense amplifier SA includes transistors 20-27 and a capacitor 28, and the bit line coupling section BLHU includes a transistor 29. The transistor 20 is a P-channel MOS transistor. Each of the transistors 21 to 27 is an N-channel MOS transistor. The transistor 29 is an N-channel MOS transistor with a breakdown voltage higher than those of the transistors 20 to 27.

The source of the transistor 20 is coupled to a power line. The drain of the transistor 20 is coupled to a node ND1. The gate of the transistor 20 is coupled to, for example, a node SINV in the latch circuit SDL. The drain of the transistor 21 is coupled to the node ND1. The source of the transistor 21 is coupled to a node ND2. A control signal BLX is input to the gate of the transistor 21. The drain of the transistor 22 is coupled to the node ND1. The source of the transistor 22 is coupled to a node SEN. A control signal HLL is input to the gate of the transistor 22.

The drain of the transistor 23 is coupled to the node SEN. The source of the transistor 23 is coupled to the node ND2. A control signal XXL is input to the gate of the transistor 23. The drain of the transistor 24 is coupled to the node ND2. A control signal BLC is input to the gate of the transistor 24. The drain of the transistor 25 is coupled to the node ND2. The source of the transistor 25 is coupled to a node SRC. The gate of the transistor 25 is coupled to, for example, the node SINV in the latch circuit SDL.

The source of the transistor 26 is grounded. The gate of the transistor 26 is coupled to the node SEN. The drain of the transistor 27 is coupled to the bus LBUS. The source of the transistor 27 is coupled to the drain of the transistor 26. A control signal STB is input to the gate of the transistor 27. One electrode of the capacitor 28 is coupled to the node SEN. A clock CLK is input to the other electrode of the capacitor 28.

The drain of the transistor 29 is coupled to the source of the transistor 24. The source of the transistor 29 is coupled to the bit line BL. A control signal BLS is input to the gate of the transistor 29.

The latch circuit SDL includes, for example, inverters 30 and 31, and N-channel MOS transistors 32 and 33. The input node of the inverter 30 is coupled to a node SLAT, and the output node of the inverter 30 is coupled to the node SINV. The input node of the inverter 31 is coupled to the node SINV, and the output node of the inverter 31 is coupled to the node SLAT. One end of the transistor 32 is coupled to the node SINV, the other end of the transistor 32 is coupled to the bus LBUS, and a control signal ST1 is input to the gate of the transistor 32. One end of the transistor 33 is coupled to the node SLAT, the other end of the transistor 33 is coupled to the bus LBUS, and a control signal STL is input to the gate of the transistor 33. For example, data retained in the node SLAT corresponds to data retained in the latch circuit SDL, and data retained in the node SINV corresponds to inversion data of data retained in the node SLAT.

The circuit configurations of the latch circuits ADL, BDL, CDL, and XDL are, for example, the same as that of the latch circuit SDL. For example, in the latch circuit ADL, data is retained in a node ALAT, and inversion data of the data is retained in a node AINV. For example, a control signal ATI is input to the gate of the transistor 32 of the latch circuit ADL, and a control signal ATL is input to the gate of the transistor 33 of the latch circuit ADL. Descriptions of the latch circuits BDL, CDL, DDL, and XDL will be omitted.

In the above-described configuration of the sense amplifier unit SAU, a source voltage VDD for example is applied to the power line coupled to the source of the transistor 20. A ground voltage VSS for example is applied to the node SRC. The control signals BLX, HLL, XXL, BLC, STB, and BLS and the clock CLK are each generated by, for example, the sequencer 13.

The circuit configuration of the sense amplifier module 16 included in the semiconductor memory device 1 according to the first embodiment is not limited to the above-described one. For example, the number of latch circuits included in each sense amplifier unit SAU may be changed as appropriate based on the number of pages stored in one cell unit CU. The logic circuit LC in the sense amplifier unit SAU may be omitted if logical operations can be executed only by the latch circuits in the sense amplifier unit SAU.

[1-1-3] Data Store Method

Figure 6:
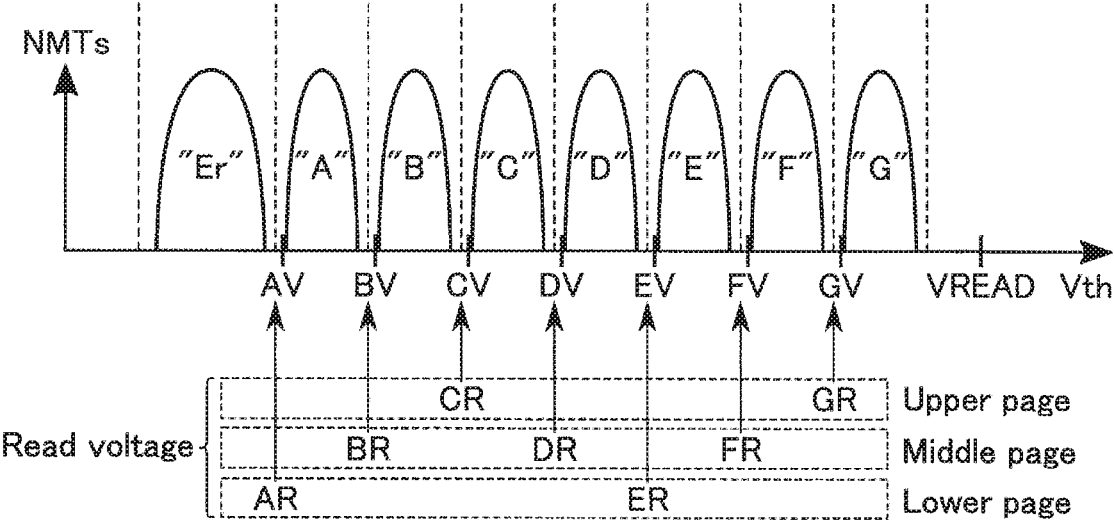
FIG. 6 is a diagram showing an example of data allocation applied to memory cell transistors in the semiconductor memory device according to the first embodiment.

FIG. 6 shows an example of the threshold voltage distribution of memory cell transistors MT, read voltages, and verify voltages in the semiconductor memory device 1 according to the first embodiment. In the threshold voltage distribution diagrams referred to below, "NMTs" of the vertical axis corresponds to the number of memory cell transistors MT, and "Vth" of the horizontal axis corresponds to the threshold voltages Vth of memory cell transistors MT.

As shown in FIG. 6, for example eight threshold voltage distribution lobes are formed by a plurality of memory cell transistors MT in the semiconductor memory 1 according to the first embodiment. The eight threshold voltage distribution lobes will be referred to as an "Er" state, "A" state, "B" state, "C" state, "D" state, "E" state, "F" state, and "G" state in ascending order of threshold voltage. The "Er" state indicates the erased state of memory cell transistors MT. The "A" state to "G" state each indicate a data-written state of memory cell transistors MT.

Different 3-bit data is allocated to each of the "Er" state to "G" state, and only 1-bit data is different between two adjacent states. Such a method of storing 3-bit data in one memory cell transistor is referred to as a triple level cell (TLC) method. Set forth below is an example of data allocation to eight threshold voltage distribution lobes:

"Er" state: "111 (upper bit/middle bit/lower bit)" data
"A" state: "110" data
"B" state: "100" data
"C" state: "000" data
"D" state: "010" data
"E" state: "011" data
"F" state: "001" data
"G" state: "101" data A verify voltage used in a write operation is set between each set of adjacent states. Specifically, a verify voltage AV is set between the "Er" state and the "A" state, a verify voltage BV is set between the "A" state and the "B" state, a verify voltage CV is set between the "B" state and the "C" state, a verify voltage DV is set between the "C" state and the "D" state, a verify voltage EV is set between the "D" state and the "E" state, a verify voltage FV is set between the "E" state and the "F" state, and a verify voltage GV is set between the "F" state and the "G" state. In a write operation, when sensing that the threshold voltage of a memory cell transistor MT in which certain data is to be stored exceeds a verify voltage corresponding to the data, the semiconductor memory device 1 completes programming on the memory cell transistor MT.

A read voltage used in a read operation is also set between each set of adjacent states. Specifically, a read voltage AR is set between the "Er" state and the "A" state, a read voltage BR is set between the "A" state and the "B" state, a read voltage CR is set between the "B" state and the "C" state, a read voltage DR is set between the "C" state and the "D" state, a read voltage ER is set between the "D" state and the "E" state, a read voltage FR is set between the "E" state and the "F" state, and a read voltage GR is set between the "F" state and the "G" state. A read pass voltage VREAD is set to a voltage higher than the highest threshold voltage of the "G" state.

The read voltages AR, BR, CR, DR, ER, FR, and GR are used respectively for distinction between the "Er" state and the "A" and higher threshold voltage states, distinction between the "A" and lower threshold voltage states and the "B" and higher threshold voltage states, distinction between the "B" and lower threshold voltage states and the "C" and higher threshold voltage states, distinction between the "C" and lower threshold voltage states and the "D" and higher threshold voltage states, distinction between the "D" and lower threshold voltage states and the "E" and higher threshold voltage states, distinction between the "E" and lower threshold voltage states and the "F" and higher threshold voltage states, and distinction between the "F" and lower threshold voltage states and the "G" and higher threshold voltage states. When the read pass voltage VREAD is applied to the gate of a memory cell transistor MT, the memory cell transistor MT is turned on regardless of the data stored therein. In a read operation, the semiconductor memory device 1 determines read data by using read voltages to judge the state to which the memory cell transistor MT belongs.

For example, when the data allocation shown in FIG. 6 is applied, 1-page data constituted by the lower bits (lower page data) is determined by a read operation using the read voltages AR and ER. 1-page data constituted by the middle bits (middle page data) is determined by a read operation using the read voltages BR, DR, and FR. 1-page data constituted by the upper bits (upper page data) is determined by a read operation using the read voltages CR and GR. In a page read operation in which a plurality of read voltages are used, the logic circuit LC executes arithmetic processing as appropriate.

The above-described number of bits of data stored in one memory cell transistor MT is merely an example, and the number is not limited thereto. For example, 1-bit, 2-bit, or 4 or more-bit data may be stored in one memory cell transistor MT. In the semiconductor memory device 1, the number of threshold voltage distribution lobes to be formed, read voltages, read pass voltage, and verify voltages, etc. are set as appropriate in accordance with the number of bits stored in one memory cell transistor MT.

[1-2] Operation of Semiconductor Memory Device 1

Next, the operation of the semiconductor memory device 1 according to the first embodiment will be described. Hereinafter, a selected word line WL will be referred to as WLsel, and a non-selected word line WL will be referred to as WLusel. Application of a voltage to a word line WL corresponds to application of a voltage via a signal line CG and the row decoder module 15 to the line by the driver module 14. The command CMD and address information ADD received by the semiconductor memory device 1 are transferred to the command register 11 and address register 12, respectively. The write data received by the semiconductor memory device 1 is transferred to a plurality of latch circuits XDL in a plurality of sense amplifier units SAU included in the sense amplifier module 16.

[1-2-1] Overview of Write-Operation

Figure 7:
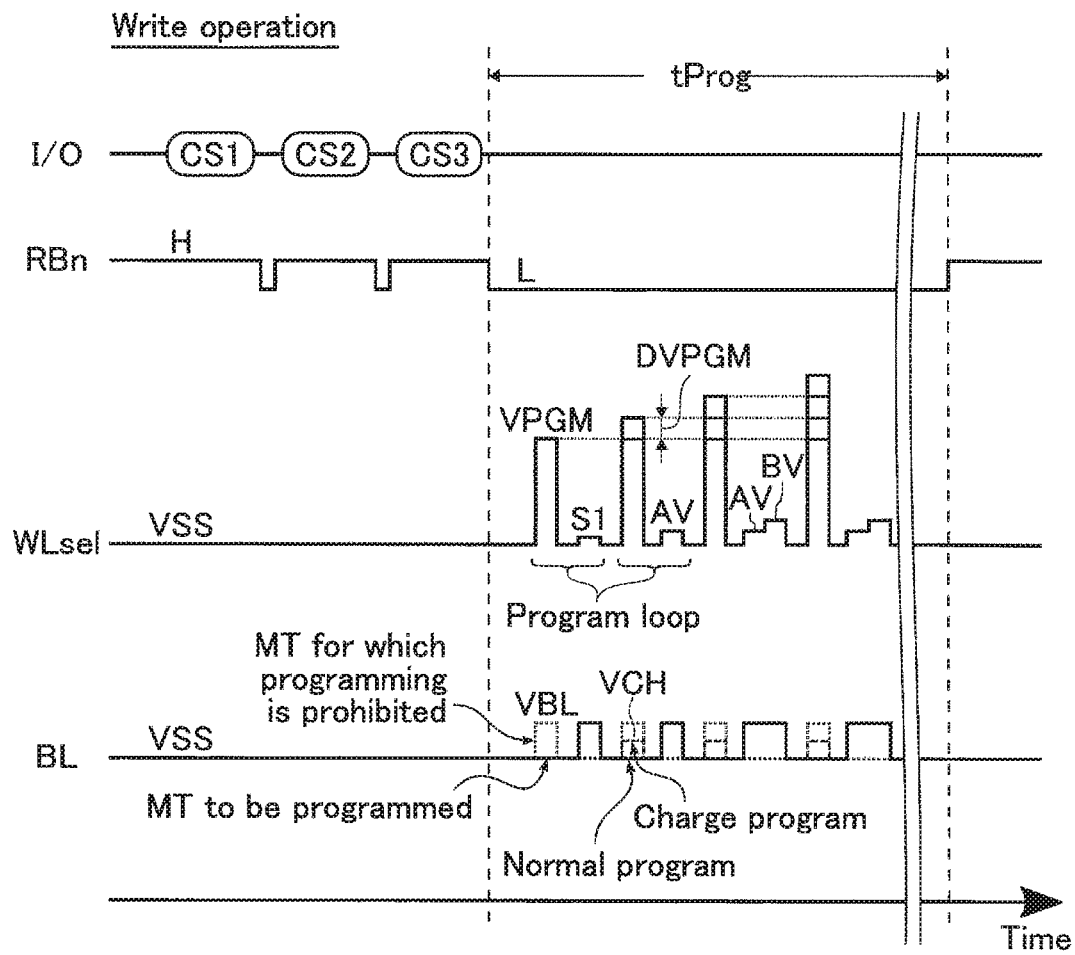
FIG. 7 is a timing chart showing an example of a write operation in the semiconductor memory device according to the first embodiment.

First, an overview of a write operation in the semiconductor memory device 1 according to the first embodiment will be described. FIG. 7 shows an example of a command sequence and timing chart of a write operation in the semiconductor memory device 1 according to the first embodiment, and shows voltages applied to the word line WLsel and bit line BL. As shown in FIG. 7, in the state before the write operation, for example, the ready/busy signal RBn is at the "H" level, and the voltages of the word line WLsel and bit line BL are VSS.

First, the memory controller 2 sequentially transmits command sets CS1, CS2, and CS3 to the semiconductor memory device 1. The command sets CS1 to CS3 each include, for example, a command to execute a write operation and address information, and include write data of the lower page, middle page, and upper page, respectively.

Upon receipt of the command set CS1, the write data of the lower page is stored in each latch circuit XDL, and the semiconductor memory device 1 temporarily transitions from the ready state to the busy state. Then, the sequencer 13 causes the write data of the lower page retained in each latch circuit XDL to be transferred to, for example, the latch circuit ADL that shares the bus LBUS with the latch circuit XDL in the sense amplifier unit SAU. Subsequently, the semiconductor memory device 1 transitions to the ready state.

Upon receipt of the command set CS2, the semiconductor memory device 1 temporarily transitions from the ready state to the busy state. Then, the sequencer 13 causes the write data of the middle page retained in each latch circuit XDL to be transferred to, for example, the latch circuit BDL that shares the bus LBUS with the latch circuit XDL in the sense amplifier unit SAU.

Upon receipt of the command set CS3, the semiconductor memory device 1 transitions from the ready state to the busy state. The sequencer 13 then starts a write operation based on the command CMD retained in the command register 11, the address information ADD retained in the address register 12, and the write data retained in the sense amplifier module 16. In the write operation, the sequencer 13 repeatedly executes a program loop. The program loop includes, for example, a program operation and a verify operation.

The program operation is an operation for increasing the threshold voltage of a memory cell transistor MT. In the program operation, the memory cell transistors MT in the selected cell unit CU are set as a memory cell transistor MT to be programmed or a memory cell transistor MT for which programming is prohibited, based on the write data retained in the sense amplifier unit SAU. Specifically, a memory cell transistor MT with a threshold voltage that has not reached the threshold voltage of the state corresponding to the write data retained in the sense amplifier unit SAU (hereinafter referred to as a "write state") is set as a memory cell transistor MT to be programmed, and a memory cell transistor MT with a threshold voltage that has reached the threshold voltage of the write state is set as a memory cell transistor MT for which programming is prohibited.

In the program operation, a program voltage VPGM is applied to the word line WLsel. The program voltage VPGM is a high voltage capable of increasing the threshold voltages of memory cell transistors MT. When the program voltage VPGM is applied to the word line WLsel, the threshold voltage of the memory cell transistor MT coupled to the word line WLsel and coupled to the bit line BL to be programmed increases. On the other hand, an increase of the threshold voltage of the memory cell transistor MT coupled to the word line WLsel and coupled to the bit line BL of the memory cell transistor MT for which programming is prohibited is suppressed by, for example, a self-boost technique. Upon completion of the program operation, the sequencer 13 proceeds to the verify operation.

The verify operation is a read operation for judging whether or not the threshold voltage of a memory cell transistor MT in a selected cell unit CU has reached the threshold voltage of the write state. In the verify operation, a verify voltage used for the threshold voltage judgment is determined for each sense amplifier unit SAU. Hereinafter, the state for which a verification is executed will be referred to as a verify state. The verify state may be changed as appropriate in accordance with the progress of the program loops.

A memory cell transistor MT confirmed as having reached the threshold voltage of the write state by a verify read is judged as having passed the verification. Each sense amplifier unit SAU stores the write state verification result in a latch circuit therein. The sequencer 13 then refers to the judgment result of each sense amplifier unit SAU, counts, for each write state, the number of memory cell transistors MT for which writing has been completed, and judges whether or not writing of the state has been completed.

A set of the above-described program operation and verify operation corresponds to one program loop. The program voltage VPGM is stepped up whenever the program loop is repeated. Namely, the program voltage VPGM applied to the word line WLsel increases as the number of executed program loops increases. The step-up width DVPGM of the program voltage VPGM may be set to any value.

In the repetition of the program loop, the sequencer 13 ends the write operation when detecting that, for example, the number of memory cell transistors MT that have not passed the verifications of the "A" state to "G" state has fallen below a predetermined number, and causes the semiconductor memory device 1 to transition from the busy state to the ready state. When the write operation ends, 3-page data is written in the selected cell unit CU. The "tProg" in the FIG. 7 corresponds to the time during which a write operation is executed.

In the semiconductor memory device 1 according to the first embodiment, the sequencer 13 executes a verify operation using a verify voltage S1 in the first program loop, and changes the setting of the second and subsequent program loops based on the result of the verify operation. Hereinafter, the first program loop and the second and subsequent program loops will be described.

First, the first program loop will be described. In the program operation in the first program loop, the program voltage VPGM is applied to the word line WLsel. At this time, VSS is applied to the bit line BL of the memory cell transistor MT to be programmed, whereas VBL is applied to the bit line BL of the memory cell transistor MT for which programming is prohibited. Thereafter, the verify voltage S1 is applied to the word line WLsel in the verify operation. Herein, the read operation using the verify voltage S1 is referred to as a classification read. In addition, the program loop including the classification read is referred to as a classification program loop. Through the classification read, the sequencer 13 classifies the memory cell transistors MT to be programmed into a high threshold voltage group and a low threshold voltage group.

Next, the second and subsequent program loops will be described. In the program operations in the second and subsequent program loops, a program voltage obtained by stepping up the program voltage VPGM by the DVPGM is applied to the word line WLsel. At this time, VCH is applied to the bit lines BL coupled to the memory cell transistors MT classified into the high threshold voltage Vth group by the classification read among the bit lines BL coupled to the memory cell transistors MT to be programmed, and VSS is applied to the other bit lines BL. VBL is applied to the bit lines BL coupled to the memory cell transistors MT for which programming is prohibited. Hereinafter, a program operation in which VSS is applied to bit lines BL is referred to as a normal program, and a program operation in which VCH is applied to bit lines BL is referred to as a charge program. Subsequently, the verify voltage corresponding to the write state is applied to the word line WLsel in the verify operation. For example, in the verify read in the second program loop, a read operation using the verify voltage AV is executed.

FIG. 8 shows an example of changes in the threshold voltage distribution of the memory cell transistors MT caused by the program operation after the classification read of the semiconductor memory device 1 according to the first embodiment. FIG. 8(1) shows an example of the threshold voltage distribution of memory cell transistors MT when the classification read is executed. FIG. 8(2) shows an example of changes in the threshold voltage distribution of the memory cell transistors MT classified into a group of memory cell transistors MT having low threshold voltages (hereinafter referred to as a low-Vth group) in FIG. 8(1). FIG. 8(3) shows an example of changes in the threshold voltage distribution of the memory cell transistors MT classified into a group of memory cell transistors MT having high threshold voltages (hereinafter referred to as a high-Vth group) in FIG. 8(1).

In FIG. 8(1), the width of the threshold voltage distribution lobe of memory cell transistors MT is defined as VW1.

Through the classification read using the verify voltage S1, the sequencer 13 divides the threshold voltage distribution lobe into the low-Vth group and the high Vth group. Namely, the memory cell transistors MT in the low-Vth group have threshold voltages lower than or equal to the verify voltage S1, and the memory cell transistors MT in the high-Vth group have threshold voltages higher than the verify voltage S1.

In the program loop after the classification read, the sequencer 13 executes the normal program on the memory cell transistors MT included in the low-Vth group, and executes the charge program on the memory cell transistors MT included in the high-Vth group. Namely, in the first embodiment, the program operation on the high-Vth group changes from the normal program to the charge program after the classification read.

When the normal program is executed on the memory cell transistors MT in the low-Vth group, the threshold voltage distribution of the low-Vth group changes as shown in FIG. 8(2). As shown in FIG. 8(2), the threshold voltages of the memory cell transistors MT in the low-Vth group are increased by an approximately constant amount by every program loop. This is because the amount of the threshold voltage increase depends on the DVPGM.

When the charge program is executed on the memory cell transistors MT in the high-Vth group, the threshold voltage distribution of the high-Vth group changes as shown in FIG. 8(3). As shown in FIG. 8(3), the threshold voltages of the memory cell transistors MT in the high-Vth group are increased by a small amount only in the first program operation after the classification read, and by an approximately constant amount in each of the second and subsequent programs. The reason why the threshold voltage increase is small only in the first program operation after the classification read is that application of VCH to bit lines BL decreases the voltage difference between the gate and channel of each memory cell transistor MT, and thereby makes the substantial change in the program voltage smaller than the DVPGM. The threshold voltage increase in the second and subsequent program operations after the classification read is approximately the same as that in the normal program.

As described above, in the program loops after the classification read, the threshold voltage increase by the first program operation varies between the low-Vth group and the high-Vth group. Specifically, the increase in the threshold voltages of the memory cell transistors MT in the low-Vth group is larger than that of the memory cell transistors MT in the high-Vth group. Consequently, in the program loop after the classification read, the difference between the threshold voltages of the memory cell transistors MT in the low-Vth group and those of the memory cell transistors MT in the high-Vth group decreases. Namely, the width VW2 of the threshold voltage distribution lobe after execution of the first program operation after the classification read becomes smaller than the width VW1 of the threshold voltage distribution lobe before the classification read.

[1-2-2] Example of Write Operation

Figure 9:
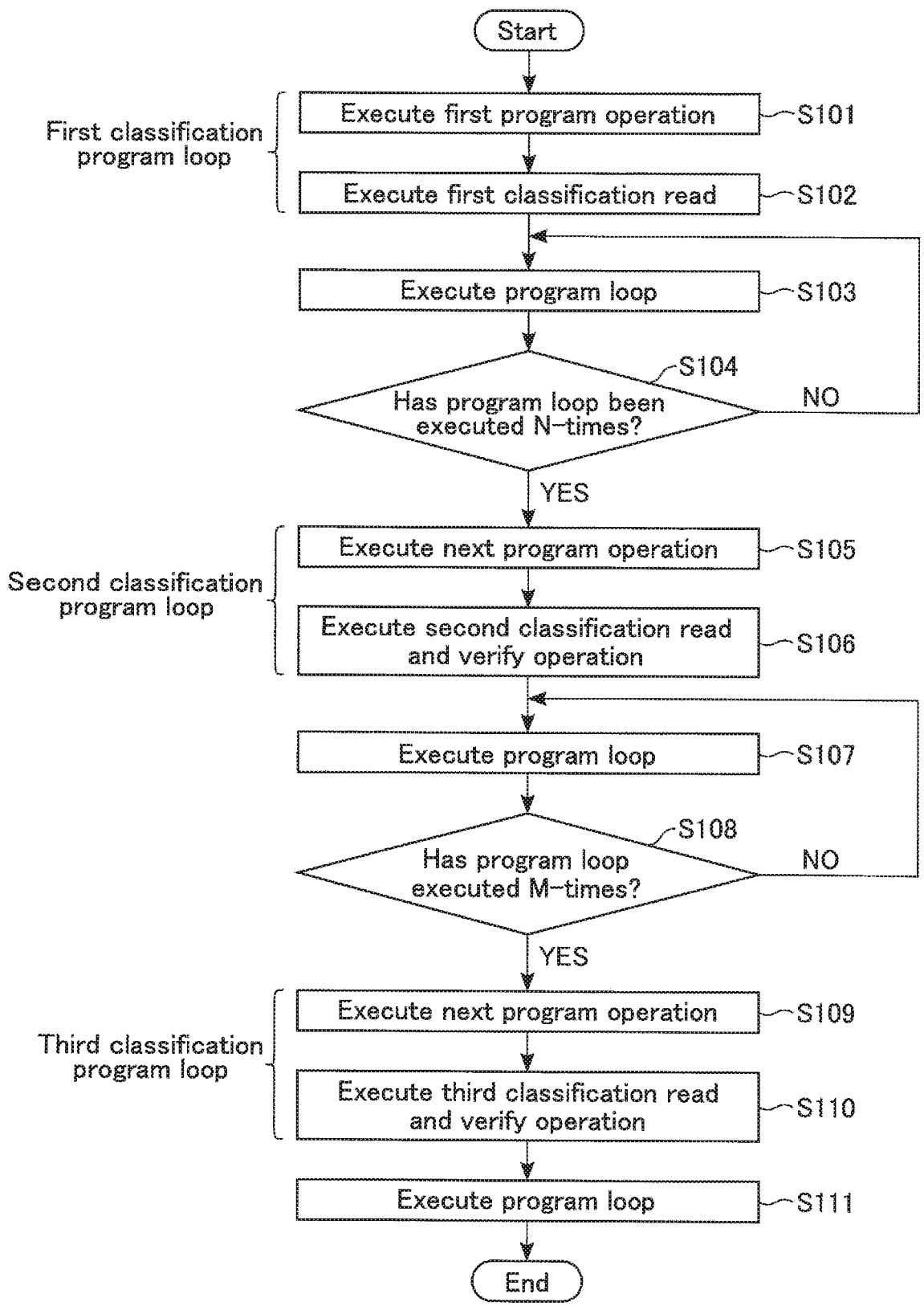
FIG. 9 is a flowchart showing an example of the write operation in the semiconductor memory device according to the first embodiment.

In the semiconductor memory device 1 according to the first embodiment, the classification read may be executed multiple times in accordance with the progress of the program loops. Described below with reference to FIGS. 9 to 11 is the case where three classification reads are executed in a write operation of the semiconductor memory device 1 according to the first embodiment, and three types of verify voltages S1 to S3 are used. Hereinafter, memory cell transistors MT whose write states are "Er" state to "G" state in a write operation will be referred to as "Er" write to "G" write memory cell transistors MT, respectively.

FIG. 9 is a flowchart showing an example of the write operation in the semiconductor memory device according to the first embodiment, and shows a series of steps in which three classification reads are executed from when the semiconductor memory device 1 starts writing. FIG. 10 shows an example of voltages applied to bit lines BL at the time of programing of the semiconductor memory device 1 according to the first embodiment. In this example, the verify voltage S1 (to be described with reference to FIG. 11) is associated with programming of the "A" state and "B" state. The verify voltage S2 is associated with programming of the "C" state to "E" state. The verify voltage S3 is associated with programming of the "F" state and "G" state. Let us assume that the memory cell transistors MT to be programmed in the first program loop are included in the first group.

The sequencer 13 first executes a first program operation (step S101). At this time, the voltages shown in FIG. 10(1) are applied to the bit lines BL. Specifically, in the first program, VSS is applied to the bit lines BL coupled to "A" write to "G" write memory cell transistors MT included in the first group.

Referring back to FIG. 9, the sequencer 13 then executes a first classification read (step S102). In the first classification read, the "A" write to "G" write memory cell transistors MT are classified into the first group (low-Vth group) and the second group (high-Vth group). The memory cell transistors MT in the first group have threshold voltages lower than or equal to the verify voltage S1. The memory cell transistors MT in the second group have threshold voltages higher than the verify voltage S1. The processing of steps S101 and S102 corresponds to the first classification program loop.

The sequencer 13 then executes a program loop based on the first classification read result (step S103). At this time, the voltages shown in FIG. 10(2) are applied to the bit lines BL. Specifically, VSS is applied to the bit lines BL coupled to the memory cell transistors MT in the first group and the "C" write to "G" write memory cell transistors MT in the second group. VCH is applied to the bit lines BL coupled to the "A" write and "B" write memory cell transistors MT in the second group.

The sequencer 13 then judges whether or not a program loop has been executed N-times (where N is an integer larger than or equal to 2) (step S104). When the sequencer 13 judges that a program loop has not been executed N-times (No in step S104), the sequencer 13 returns to the processing of step S103, and executes a program loop again. When the sequencer 13 judges that a program loop has been executed N-times (Yes in step S104), the sequencer 13 executes the next program operation (step S105).

After the processing of step S105, the sequencer 13 executes a second classification read and a verify operation (step S106). In the second classification read, "C" write to "G" write memory cell transistors MT are classified into the third group (low-Vth group) and the fourth group (high-Vth group). The memory cell transistors MT in the third group have threshold voltages lower than or equal to the verify voltage S2. The memory cell transistors MT in the fourth group have threshold voltages higher than the verify voltage S2. The processing of steps S105 and S106 corresponds to the second classification program loop.

The sequencer 13 then executes a program loop based on the second classification read result (step S107). At this time, the voltages shown in FIG. 10(3) are applied to the bit lines BL. Specifically, VSS is applied to the bit lines BL coupled to the memory cell transistors MT in the first group and the third group and the "F" write and "G" write memory cell transistors MT in the fourth group. VCH is applied to the bit lines BL coupled to the memory cell transistors MT in the second group and the "C" write to "E" write memory cell transistors MT in the fourth group.

Then, the sequencer 13 judges whether or not a program loop has been executed M-times (where M is an integer larger than N) (step S108). When the sequencer 13 judges that a program loop has not been executed M-times (No in step S108), the sequencer 13 returns to the processing of step S107, and executes a program loop again. When the sequencer 13 judges that a program loop has been executed M-times (Yes in step S108), the sequencer executes the next program operation (step S109).

After the processing of step S109, the sequencer 13 executes a third classification read and a verify operation (step S110). In the third classification read, "F" write and "G" write memory cell transistors MT are classified into the fifth group (low-Vth group) and the sixth group (high-Vth group). The memory cell transistors MT in the fifth group have threshold voltages lower than or equal to the verify voltage S3. The memory cell transistors MT in the sixth group have threshold voltages higher than the verify voltage S3. The processing of steps S109 and S110 corresponds to the third classification program loop.

The sequencer 13 then executes a program loop based on the third classification read result (step S111). At this time, the voltages shown in FIG. 10(3) are applied to the bit lines BL. Specifically, VSS is applied to the bit lines BL coupled to the memory cell transistors MT in the first group, third group, and fifth group. VCH is applied to the bit lines BL coupled to the memory cell transistors MT in the second group, fourth group, and sixth group.

FIG. 11 shows an example of changes in the threshold voltage distribution of memory cell transistors MT when classification reads are performed in the write operation of the semiconductor memory device 1 according to the first embodiment. As shown in FIG. 11, the sequencer 13 executes a classification read in accordance with the progress of the program loops (increase of Vth), and executes grouping according to the threshold voltages. FIGS. 11(1) to (3) correspond to the threshold voltage distributions of memory cell transistors MT when the first to third classification reads are executed, respectively.

As shown in FIG. 11(1), the first classification read is executed after the first program operation is executed. The threshold voltage distribution of the cell units CU on which the first program operation has been executed is lower than the verify voltage AV, for example. In the program operation after the first classification read, the increase in the threshold voltages of the "A" write and "B" write memory cell transistors MT in the second group is suppressed. Consequently, the width of the threshold voltage distribution lobe formed by the "A" write and "B" write memory cell transistors MT is reduced. In addition, the timing when the threshold voltages of the "A" write and "B" write memory cell transistors MT classified into the high-Vth group exceed AV and BV, respectively, is delayed. The delay in the timing corresponds to the increase in the number of program loops executed until the verification is passed.

As shown in FIG. 11(2), the second classification read is executed after the N-th program operation is executed. The threshold voltage distribution of the cell units CU on which the N-th program operation has been executed is lower than the verify voltage CV, for example. In the program operation after the second classification read, the increase in the threshold voltages of the "C" write to "E" write memory cell transistors MT in the fourth group is suppressed. Consequently, the width of the threshold voltage distribution lobe formed by the "C" write to "E" write memory cell transistors MT is reduced. In addition, the timing when the threshold voltages of the "C" write to "E" write memory cell transistors MT classified into the high-Vth group exceed CV to EV, respectively, is delayed.

As shown in FIG. 11(3), the third classification read is executed after the M-th program operation is executed. The threshold voltage distribution of the cell units CU on which the M-th program operation has been executed is lower than the verify voltage FV, for example. In the program operation after the third classification read, the increase in the threshold voltages of the "F" write and "G" write memory cell transistors MT in the sixth group is suppressed. Consequently, the width of the threshold voltage distribution lobe formed by the "F" write and "G" write memory cell transistors MT is reduced. In addition, the timing when the threshold voltages of the "F" write and "G" write memory cell transistors MT classified into the high Vth group exceed FV and GV, respectively, is delayed.

It is preferable that the verify voltages S1 to S3 be each set to a middle voltage of the threshold voltage distribution lobe of the memory cell transistors MT of the associated write state when the associated classification read is executed. Described above as an example is the case where the sequencer 13 executes three classification reads in the write operation, but the embodiment is not limited to this. In the first embodiment, the sequencer 13 only has to execute at least two classification reads in the write operation, and use the normal program and charge program properly based on the classification read results.

[1-3] Advantageous Effect of First Embodiment

The above-described semiconductor memory device 1 according to the first embodiment can reduce the number of verification reads, and reduce the total time of the write operation. Details of the advantageous effect of the semiconductor memory device 1 according to the first embodiment will be described below.

Figures 12, 13:
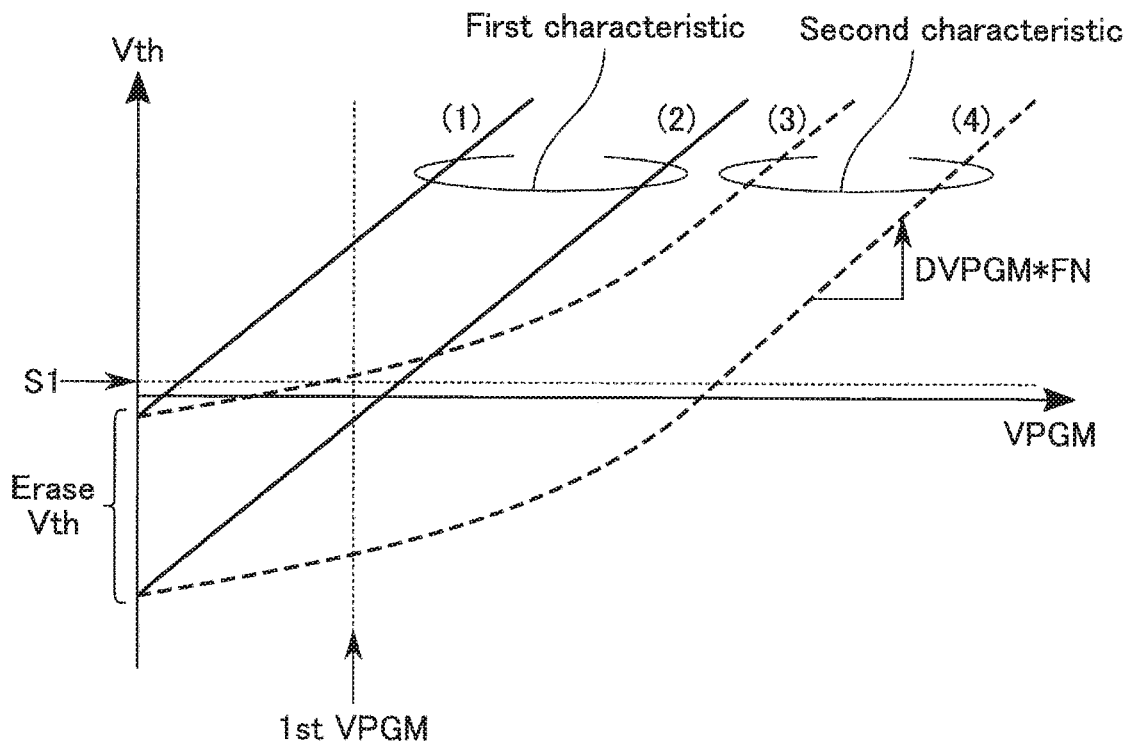
FIG. 12 is a table showing an example of states set as verification objects in a write operation of a semiconductor memory device according to a first comparative example.
FIG. 13 is a graph showing an example of the relationship between program voltages and changes in the threshold voltages of memory cell transistors in a semiconductor memory device.

In the write operation of the semiconductor memory device, the time required for verify operations tends to increase as the number of write states increases. This is because the number of verify reads in one program loop increases. FIG. 12 shows an example of the states set as verification targets in the write operation of a semiconductor memory device according to a first comparative example. As shown in FIG. 12, in the semiconductor memory device according to the first comparative example, the states of the verification targets change in accordance with the progress of the program loops. Specifically, the states of the verification targets are set based on the timing at which the threshold voltage distribution lobe that changes in accordance with the progress of the program loops is estimated to arrive in the vicinity of each verify voltage and the timing at which it is expected to exceed the verify voltage.

To reduce the number of verification reads executed for each state, it is effective to narrow the threshold voltage distribution lobe of the memory cell transistors MT under writing. As a method for narrowing the threshold voltage distribution lobe, for example, execution of a classification read and a program operation based on the classification read is conceivable. An example of this operation will be briefly described as a second comparative example. The classification read is executed, for example, after the first program operation is executed to classify the memory cell transistors MT to be programmed into a low-Vth group and a high-Vth group. In the next program loop, for example the program operation on the memory cell transistors MT in the high-Vth group is changed from the normal program to the charge program.

Accordingly, in the program loop after the classification read, the threshold voltage increase in the first program operation can be varied between the low-Vth group and the high-Vth group. Specifically, the increase in the threshold voltages of the memory cell transistors MT in the high-Vth group becomes smaller than that of the memory cell transistors MT in the low-Vth group. As a result, the width of the threshold voltage distribution lobe after the first program operation after the classification read becomes smaller than the width of the threshold voltage distribution lobe before the classification read. By narrowing the width of the threshold voltage distribution lobe, the number of verification reads executed for each state can be reduced.

However, the write operation in the second comparative example may not be able to suppress variation in the threshold voltage between memory cell transistors MT to be provided with high threshold voltages. An example of the characteristics of the memory cell transistors MT will be described with reference to FIG. 13. FIG. 13 shows an example of the dependence of threshold voltages Vth of memory cell transistors MT on the VPGM. It is considered that the threshold voltages Vth of memory cell transistors MT change relative to the VPGM as shown by (1) to (4) in FIG. 13, for example.

The memory cell transistors MT of (1) and (2) in FIG. 13 have a first characteristic, and the memory cell transistors MT of (3) and (4) in FIG. 13 have a second characteristic. The threshold voltages Vth of the memory cell transistors MT having the first characteristic are proportional to DVGPM×FN (where FN is a predetermined coefficient) from the beginning. The threshold voltages Vth of the memory cell transistors MT having the second characteristic increase at a low rate with respect to the DVPM at the beginning, and become proportional to DVGPM×FN after the VPGM has increased to a certain point. Namely, the threshold voltage increase varies between the memory cell transistors MT having the first characteristic and those having the second characteristic when the VPGM is lower than or equal to a predetermined voltage, and is similar between the memory cell transistors MT having the first characteristic and those having the second characteristic when the VPGM exceeds the predetermined voltage.

The classification read in the second comparative example is executed after the program operation using the initial VPGM (1st VPGM) is executed from the state where the write state is the "Er" state. In the classification read, the verify voltage S1 is used, and all the memory cell transistors MT to be programmed are classified into the low-Vth group and the high-Vth group. For example, the memory cell transistors MT of (2) and (4) in FIG. 13 are classified into the low-Vth group, and the memory cell transistors MT of (1) and (3) in FIG. 13 are classified into the high-Vth group.

However, when the program loops proceed after the classification read, the threshold voltage of a memory cell transistor MT of (2) in FIG. 13, which has the first characteristic, may exceed the threshold voltage of a memory cell transistor MT of (3) in FIG. 13, which has the second characteristic. Namely, in the write operation of the second comparative example, the threshold voltage distribution lobe of the memory cell transistors MT becomes narrow in the program loop immediately after the classification read, but may become wider as the program loops proceed. Therefore, in the second comparative example, the risk of overwriting increases when a verify operation of a high write state is omitted.

FIG. 14 shows an example of the states set as verification targets in the write operation of the semiconductor memory device according to the second comparative example. As shown in FIG. 14, in the second comparative example, verifications of states can be omitted in the program loops in the first half of the write operation, but are preferably added in accordance with the widening of the threshold voltage distribution lobes in the program loops in the latter half of the write operation. Therefore, in the write operations in the second comparative example, the number of verifications of high write states are difficult to be reduced.

In the semiconductor memory device 1 according to the first embodiment, a classification read associated with a group of write states is executed multiple times in accordance with the progress of the program loops. Specifically, when the threshold voltages of memory cell transistors MT under writing becomes close to the verify voltage of the group, the sequencer 13 executes the classification read corresponding to the group. Accordingly, the second and subsequent classification reads are executed on threshold voltage distribution lobes that have become widened based on the characteristics of the memory cell transistors MT.

The semiconductor memory device 1 according to the first embodiment can thereby suppress the increase in the threshold voltages of the high write state memory cell transistors MT in the high-Vth group. In addition, the semiconductor memory device 1 according to the first embodiment can reduce the widths of the threshold voltage distribution lobes of the memory cell transistors MT of the write states corresponding to the second and subsequent classification reads. As a result, the semiconductor memory device 1 according to the first embodiment can delay the start timing of the verification read of each state in the write operation.

FIG. 15 shows an example of the states set as verification targets in the write operation of the semiconductor memory device 1 according to the first embodiment. As shown in FIG. 15, the verification reads in the first embodiment can be partly omitted in comparison to the second comparative example. As described above, the semiconductor memory device 1 according to the first embodiment can reduce the number of verification reads in the write operation, and reduce the total time required for the write operation.

[2] Second Embodiment

The semiconductor memory device 1 according to a second embodiment has a configuration similar to the configuration of the semiconductor memory device 1 according to the first embodiment. The semiconductor memory device 1 according to the second embodiment executes a write operation in which the increase in the threshold voltages of the memory cell transistors MT in the low-Vth group is increased after a classification read. Hereinafter, the semiconductor memory device 1 according to the second embodiment will be described with respect to the points different from the semiconductor memory device 1 according to the first embodiment.

[2-1] Write Operation

FIG. 16 shows an example of changes in the threshold voltage distribution of memory cell transistors MT caused by the program operation after a classification read of the semiconductor memory device 1 according to the second embodiment. FIG. 16(1) shows an example of the threshold voltage distribution of memory cell transistors MT when the classification read is executed. FIGS. 16(2) and (3) each show an example of changes in the threshold voltage distribution of the memory cell transistors MT classified into the low-Vth group and the high-Vth group in FIG. 16(1), respectively. In the second embodiment, the sequencer 13 executes the charge program on the write-target memory cell transistors MT in the program loop before the classification read is executed.

In FIG. 16(1), as in the first embodiment, the sequencer 13 divides the threshold voltage distribution lobe into the low-Vth group and the high Vth group through a classification read using the verify voltage S1. In the second embodiment, in the program loop after the classification read, the sequencer 13 executes the normal program on the memory cell transistors MT included in the low-Vth group, and executes the charge program on the memory cell transistors MT included in the high-Vth group. In the second embodiment, the charge program is executed in the program loop before the classification read, and the program operation on the low-Vth group changes from the charge program to the normal program after the classification read.

When the charge program is executed on the memory cell transistors MT in the low-Vth group, the threshold voltage distribution of the low-Vth group changes as shown in FIG. 16(2). As shown in FIG. 16(2), the threshold voltages of the memory cell transistors MT in the low-Vth group, which are increased in each program loop, are increased by a large amount only in the first program loop and by an approximately constant amount in each of the second and subsequent program loops. The reason why the threshold voltage increase is large only in the first program loop is that the voltage applied to the bit line BL changes from VCH to VSS, whereby the voltage difference between the gate and channel of the memory cell transistor MT increases, and the substantial program voltage change amount becomes larger than the DVPGM. The threshold voltage increase in each of the second and subsequent program loops after the classification read is approximately the same as that in the normal program. This is because the amount of the threshold voltage increase depends on the DVPGM.

In contrast, when the normal program is executed on the memory cell transistors MT in the high-Vth group, the threshold voltage distribution of the high-Vth group changes as shown in FIG. 16(3). As shown in FIG. 16(3), the threshold voltages of the memory cell transistors MT of the high-Vth group, which are increased in each program loop, are increased by an approximately constant amount as in the normal program.

As described above, in the program loop after the classification read, the threshold voltage increase by the first program operation varies between the low-Vth group and the high-Vth group. Specifically, the increase in the threshold voltages of the memory cell transistors MT in the low-Vth group is larger than that of the memory cell transistors MT in the high-Vth group. Consequently, in the program loop after the classification read, the difference in threshold voltage between the memory cell transistors MT in the low-Vth group and those in the high-Vth group becomes small. Namely, the width VW2 of the threshold voltage distribution lobe after execution of the first program operation after the classification read becomes smaller than the width VW1 of the threshold voltage distribution lobe before the classification read.

The second embodiment is identical to the first embodiment in that the width VW2 of the threshold voltage distribution lobe becomes narrower than the width VW1 of the threshold voltage distribution lobe. In the first embodiment, the width VW2 of the threshold voltage distribution lobe is narrowed by reducing the threshold voltage increase of the high-Vth group. In the second embodiment, the width VW2 of the threshold voltage distribution lobe is narrowed by increasing the threshold voltage increase of the low-Vth group.

In the semiconductor memory device 1 according to the second embodiment, the classification read is executed multiple times in accordance with the progress of the program loops as in the first embodiment. The processing of the write operation in the semiconductor memory device according to the second embodiment is the same as the processing shown in the flowchart of FIG. 9 described in the first embodiment. In the second embodiment, the voltages applied to bit lines BL in the program operation after a classification read is different from those in the first embodiment. FIG. 17 shows an example of the voltages applied to bit lines BL at the time of programming of the semiconductor memory device 1 according to the second embodiment.

Described below with reference to FIG. 17 is an example of changes in the voltages applied to the bit lines BL coupled to the memory cell transistors MT to be programmed in the case where three classification reads are executed. In the second embodiment, setting of the verify voltages S1 to S3 and setting of the groups (first to sixth groups) of the memory cell transistors MT to be programed in the program loops are the same as those in the first embodiment.

In the first program operation, the voltages shown in FIG. 17(1) are applied to the bit lines BL. Specifically, in the first program, VSS or VCH is applied to the bit lines BL coupled to the "A" write to "G" write memory cell transistors MT included in the first group.

In the program operation after the first classification read, the voltages shown in FIG. 17(2) are applied to the bit lines BL. Specifically, VSS is applied to the bit lines BL coupled to the "A" write and "B" write memory cell transistors MT in the first group. VCH is applied to the bit lines BL coupled to the memory cell transistors MT in the second group and the "C" to "G" memory cell transistors MT in the first group.

In the program operation after the second classification read, the voltages shown in FIG. 17(3) are applied to the bit lines BL. Specifically, VSS is applied to the bit lines BL coupled to the memory cell transistors MT in the first group and the "C" write to "E" write memory cell transistors MT in the third group. VCH is applied to the bit lines BL coupled to the memory cell transistors MT in the second group and fourth group and the "F" write and "G" write memory cell transistors MT in the third group.

In the program operation after the third classification read, the voltages shown in FIG. 17(4) are applied to the bit lines BL. Specifically, VSS is applied to the bit lines BL coupled to the memory cell transistors MT in the first group, third group and fifth group. VCH is applied to the bit lines BL coupled to the memory cell transistors MT in the second group, fourth group, and sixth group. The other operations of the semiconductor memory device 1 according to the second embodiment are the same as those of the semiconductor memory device 1 according to the first embodiment.

[2-2] Advantageous Effect of Second Embodiment

As described above, in the semiconductor memory device 1 according to the second embodiment, multiple classification reads associated with write state groups are executed in accordance with the progress of the program loops as in the first embodiment. In the second and subsequent program loops, the semiconductor memory device 1 according to the second embodiment executes the charge program on write-target memory cell transistors MT, and changes the program operation on the memory cell transistors MT classified into the low-Vth group by a classification read from the charge program to the normal program.

Accordingly, the semiconductor memory device 1 according to the second embodiment can enhance the increase in the threshold voltages of high write state memory cell transistors MT in the low Vth group. The semiconductor memory device 1 according to the second embodiment can narrow the widths of the threshold voltage distribution lobes of the memory cell transistors MT in the write states corresponding to the second and subsequent classification reads. As a result, the semiconductor memory device 1 according to the second embodiment can hasten the end timing of the verification read of each state in the write operation.

FIG. 18 shows an example of the states set as verification targets in the write operation of the semiconductor memory device 1 according to the second embodiment. As shown in FIG. 18, the verification reads of the second embodiment can be partly omitted in the comparative examples as in the first embodiment. As a result, the semiconductor memory device 1 according to the second embodiment can reduce the number of verification reads in the write operation and can reduce the total time of the write operation as in the first embodiment.

[3] Modifications, Etc.

Figure 19:
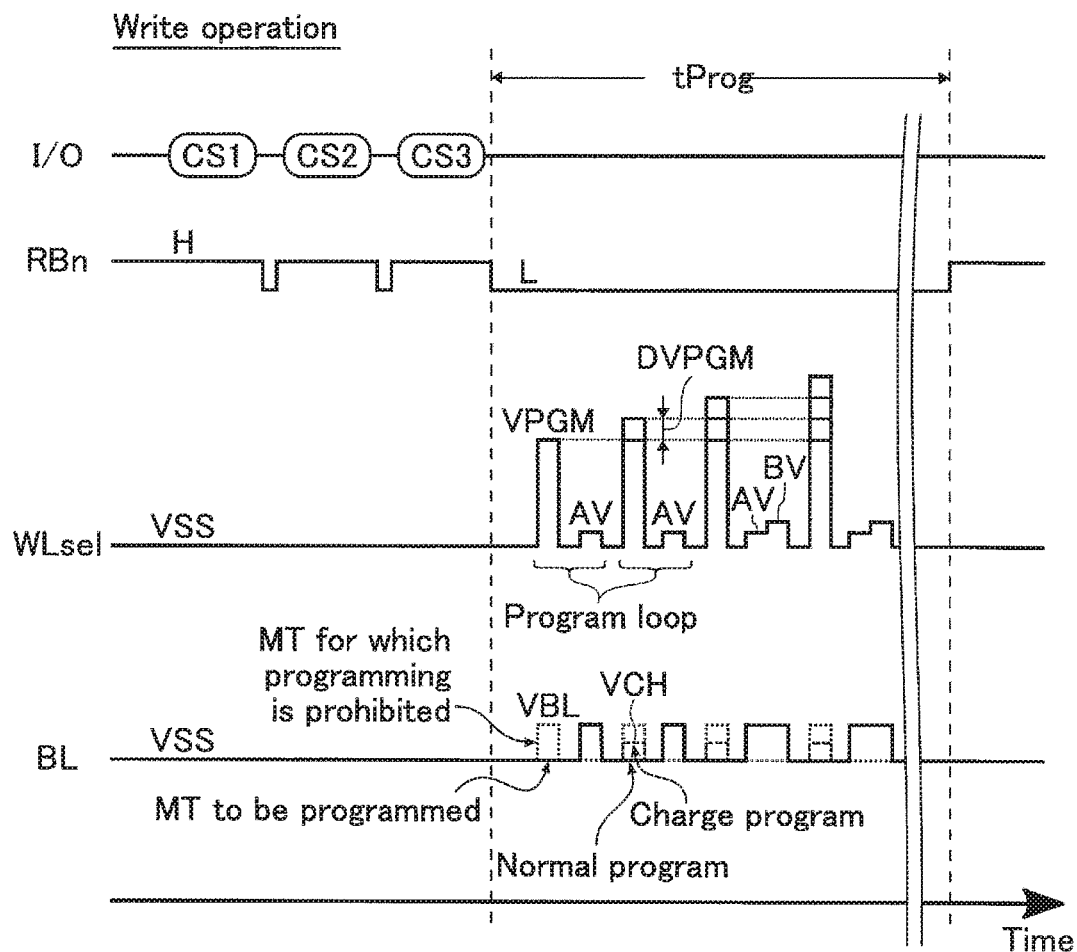
FIG. 19 is a timing chart showing an example of a write operation in a semiconductor memory device according to a first modification.

Described as examples in the above embodiments are the cases where the verify voltages S1 to S3 are used in the classification reads; however, the verify voltages used in the classification reads may be verify voltages of write states. FIG. 19 shows an example of the command sequence and timing chart of the write operation in a semiconductor memory device 1 according to a first modification of the first embodiment, and shows voltages applied to the word line WLsel and bit line BL. As shown in FIG. 19, in the write operation in the first modification of the first embodiment, for example the voltage applied in the verify operation in the first program loop is different from that shown in FIG. 7 of the first embodiment.

For example, the sequencer 13 uses the verify voltage AV of the "A" state for the classification into the low-Vth group and high-Vth group in the first modification of the first embodiment. Specifically, in the first modification, the sequencer 13 executes a verify operation using the verify voltage AV in the first program loop, and changes the settings of the second and subsequent program operations based on the result of the verify operation. Namely, based on the result of classification using the verify voltage AV in the first program loop, the sequencer 13 properly uses the normal program and the charge program in the subsequent program loops.

As described above, the sequencer 13 may execute an operation similar to the classification read described in the first embodiment, using the verify voltage of the write state. When the verify voltage of the write state is used for the classification read, the sequencer 13 executes both the verification of the associated state and classification into the low-Vth group and the high-Vth group through the verification read using the verify voltage.

As a result, the semiconductor memory device 1 according to the first modification of the first embodiment can omit the verification reads using the verify voltages S1 to S3, and thereby can reduce the number of verification reads in comparison to the first embodiment. In the write operation, the sequencer 13 may execute both of the classification read using the verify voltage set for the classification read and the classification read using the verify voltage of the write state. For example, the sequencer 13 may use the verify voltage S1 in the first classification read, and use the verify voltage BV in the second classification read. In this way, in the semiconductor memory device 1, the setting of the verify voltage used in the classification read can be changed as appropriate.

Described in the above embodiments as examples are the cases where the conditions for executing the second and subsequent classification reads are set based on the number of executed program loops; however, the embodiment is not limited to this. Other conditions may be set as the conditions for executing the second and subsequent classification reads.

Figure 20:
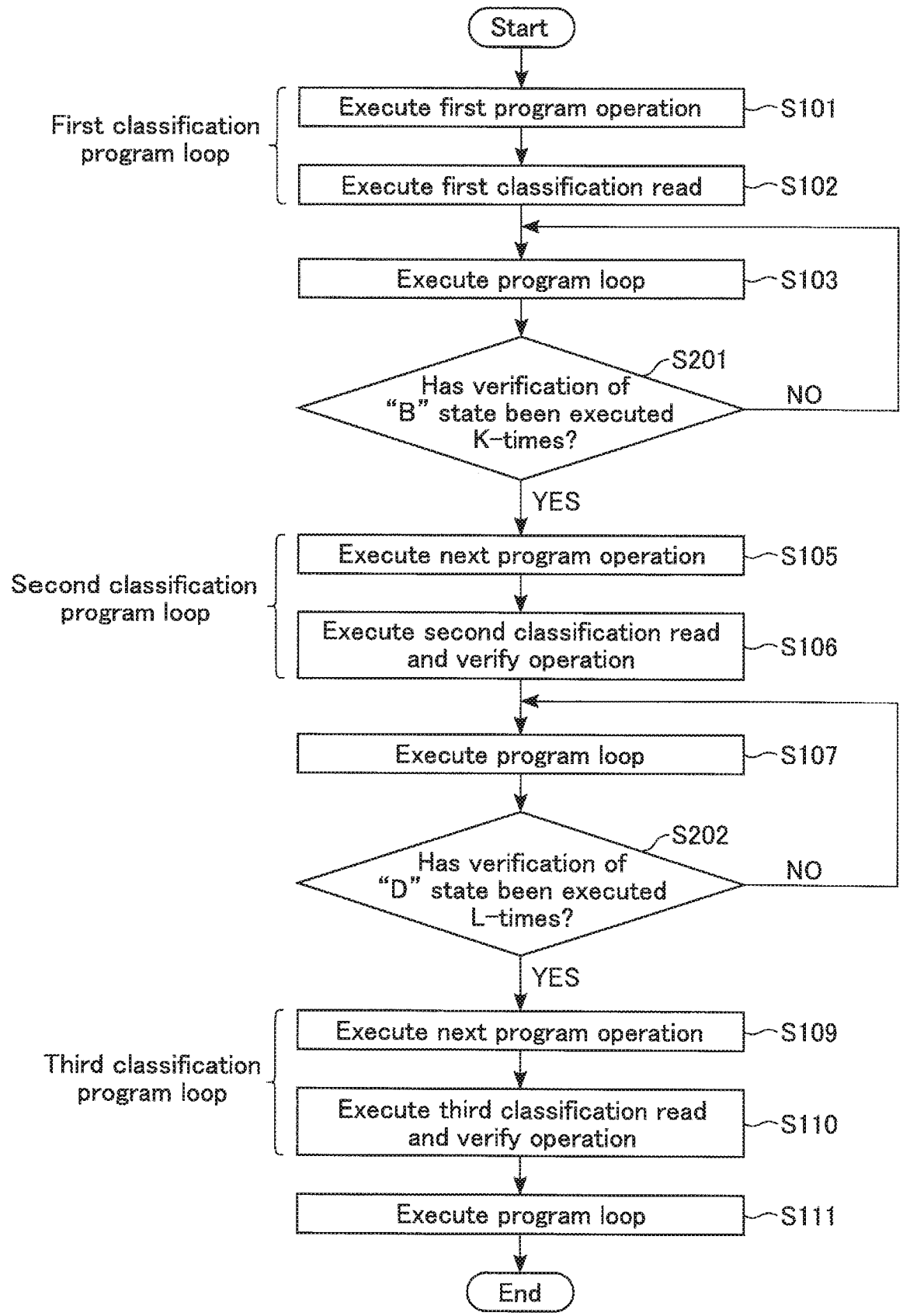
FIG. 20 is a flowchart showing an example of the write operation of the semiconductor memory device according to the first modification.

FIG. 20 is a flowchart showing an example of the write operation in a semiconductor memory device 1 according to a second modification of the first embodiment. As shown in FIG. 20, the write operation in the second modification of the first embodiment is the same as the operation of the flowchart shown in FIG. 9 in which steps S104 and S108 are replaced with steps S201 and S202, respectively.

Specifically, after step S103, the sequencer 13 judges whether or not the verification read of the "B" state has been executed K-times (where K is an integer larger than or equal to 1) (step S201). When the sequencer 13 judges that the verification read of the "B" state has not been executed K-times (No in step S201), the sequencer 13 returns to the processing of step S103, and executes a program loop again. When the sequencer 13 judges that the verification read of the "B" state has been executed K-times (Yes in step S201), the sequencer 13 proceeds to the processing of step S105.

After step S107, the sequencer 13 also judges whether or not the verification read of the "D" state has been executed L-times (where L is an integer larger than 1). When the sequencer 13 judges that the verification read of the "D" state has not been executed L-times (No in step S202), the sequencer 13 returns to the processing of step S107, and executes a program loop again. When the sequencer 13 judges that the verification read of the "D" state has been executed L-times (Yes in step S202), the sequencer 13 proceeds to the processing of step S109.

As described above, in the write operation of the second modification of the first embodiment, the sequencer 13 determines the timing of performing the second and subsequent classification reads based on the number of executed verification reads of a certain state. In this way, the semiconductor memory device 1 may execute the second and subsequent classification reads based on the number of executed verification reads of a certain state. The state of verification reads used as a trigger for the classification reads may be any state.

Figure 21:
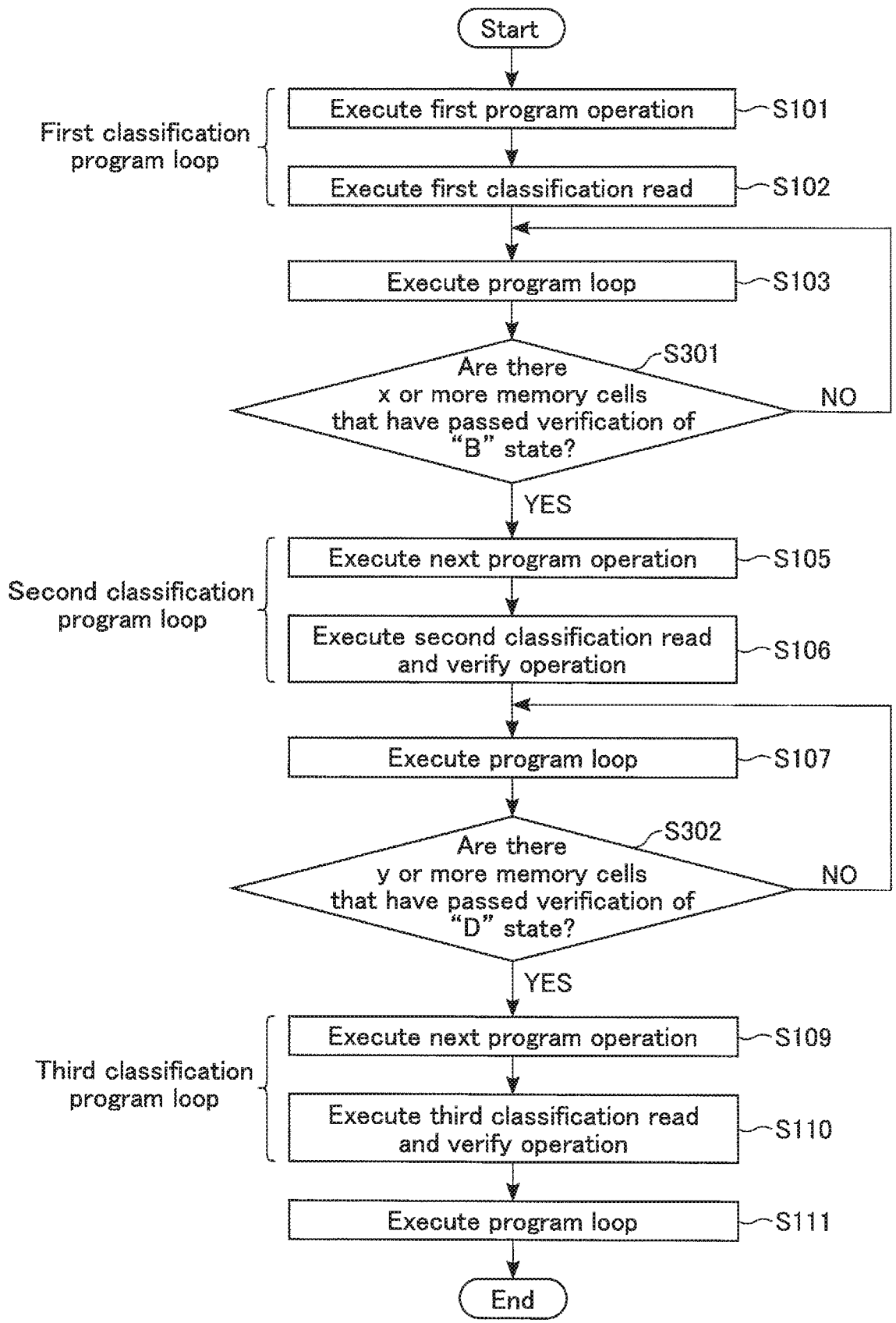
FIG. 21 is a flowchart showing an example of a write operation of a semiconductor memory device according to a second modification.

FIG. 21 is a flowchart showing an example of the write operation in the semiconductor memory device 1 according to a third modification of the first embodiment. As shown in FIG. 21, the write operation in the third modification of the first embodiment is the same as the operation of the flowchart shown in FIG. 9 in which steps S104 and S108 are replaced with steps S301 and S302, respectively.

Specifically, after step S103, the sequencer 13 judges whether or not there are x or more memory cell transistors MT that have passed the verification reads of the "B" state (where x is an integer larger than or equal to 1) (step S301). When the sequencer 13 judges that there are less than x memory cell transistors MT that have passed the verification reads of the "B" state (No in step S301), the sequencer 13 returns to step S103, and executes a program loop again. When the sequencer 13 judges that there are x or more memory cell transistors MT that have passed the verification reads of the "B" state (Yes in step S301), the sequencer 13 proceeds to the processing of step S105.

After step S107, the sequencer 13 judges whether or not there are y or more memory cell transistors MT that have passed the verification reads of the "D" state (where y is an integer larger than or equal to 1) (step S302). When the sequencer 13 judges that there are less than y memory cell transistors MT that have passed the verification reads of the "D" state (No in step S302), the sequencer 13 returns to step S107, and executes a program loop again. When the sequencer 13 judges that there are y or more memory cell transistors MT that have passed the verification reads of the "D" state (Yes in step S302), the sequencer 13 proceeds to the processing of step S109.

As described above, in the write operation of the third modification of the first embodiment, the sequencer 13 judges the timing of performing the second and subsequent classification reads based on the number of memory cell transistors MT that have passed the verification reads of a certain state. In this way, the semiconductor memory device 1 may execute the second and subsequent classification reads based on the number of memory cell transistors MT that have passed the verification reads of a certain state. The state of verification reads used as a trigger for the classification reads may be any state.

The first to third modifications of the first embodiment described above may be combined with the second embodiment. The timing charts used for the description of the read operations in the above embodiments are merely examples. For example, the timing of controlling each signal and the voltage of each line may be shifted. In the above embodiments, the voltages applied to various lines in the memory cell array 10 may be estimated based on the voltage of the signal line between the driver module 14 and the row decoder module 15. For example, the voltage applied to the word line WLsel may be estimated based on the voltage of the signal line CG.

Herein, the "H" level voltage is a voltage that turns on the N-channel MOS transistor with a gate to which the voltage is applied, and turns off the P-channel MOS transistor with a gate to which the voltage is applied. The "L" level voltage is a voltage that turns off the N-channel MOS transistor with a gate to which the voltage is applied, and turns on the P-channel MOS transistor with a gate to which the voltage is applied. "One end of the transistor" means the drain or source of the MOS transistor. "Other end of the transistor" means the source or drain of the MOS transistor.

"Coupling" herein refers to electrical coupling, and does not exclude, for example, the existence of another element between the coupled elements. "Turn off a transistor" refers to bringing the transistor into a state in which a voltage lower than the threshold voltage of the transistor is applied to the gate of the transistor, and does not exclude bringing the transistor into a state in which a microcurrent, such as a leak current in the transistor, flows in the gate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   first to fourth memory cell transistors each configured to store first data when having a first threshold voltage and to store second data different from the first data when having a second threshold voltage higher than the first threshold voltage;
   a first word line coupled to the first to fourth memory cell transistors;
   a first bit line coupled to the first memory cell transistor;
   a second bit line coupled to the second memory cell transistor;
   a third bit line coupled to the third memory cell transistor;
   a fourth bit line coupled to the fourth memory cell transistor; and
   a controller configured to execute a write operation,
   wherein:
   in the write operation, the controller executes multiple program loops including a first program loop and a second program loop after the first program loop, each of the first program loop and the second program loop including a program operation and a verify operation, and causes each of the first memory cell transistor and the second memory cell transistor to store the first data and each of the third memory cell transistor and the fourth memory cell transistor to store the second data,
   in the program operation of the first program loop, the controller applies a first voltage to each of the first to fourth bit lines when applying a program voltage to the first word line,
   in the verify operation of the first program loop, the controller classifies the first and second memory cell transistors respectively into a first group of memory cell transistors each having a low threshold voltage and a second group of memory cell transistors each having a high threshold voltage, the verify operation of the first program loop being executed by applying a first verify voltage to the first word line,
   in the program operation of each of a plurality of program loops executed after the first program loop and before the second program loop, while applying a stepped-up program voltage to the first word line, the controller applies the first voltage to the first bit line when a verification of the first memory cell transistor classified into the first group has not been passed, applies a second voltage different from the first voltage to the second bit line when a verification of the second memory cell transistor classified into the second group has not been passed, and applies one of the first voltage or the second voltage to each of the third bit line and the fourth bit line,
   in the program operation of the second program loop, while applying a stepped-up program voltage to the first word line, the controller applies the first voltage to each of the third and fourth bit lines,
   in the verify operation of the second program loop, the controller classifies the third and fourth memory cell transistors respectively into a third group of memory cell transistors each having a low threshold voltage and a fourth group of memory cell transistors each having a high threshold voltage, the verify operation of the second program loop being executed by applying a second verify voltage higher than the first verify voltage to the first word line, and
   in the program operation of each of a plurality of program loops executed after the second program loop, while applying a stepped-up program voltage to the first word line, the controller applies the first voltage to the third bit line when a verification of the third memory cell transistor classified into the third group has not been passed, and applies the second voltage to the fourth bit line when a verification of the fourth memory cell transistor classified into the fourth group has not been passed.

2. The semiconductor memory device of claim 1, wherein the second voltage is higher than the first voltage.

3. The semiconductor memory device of claim 2, wherein, in the program operation of each of a plurality of program loops executed after the first program loop and before the second program loop, while applying the stepped-up program voltage to the first word line, the controller applies the first voltage to each of the third and fourth bit lines.

4. The semiconductor memory device of claim 2, wherein, in the program operation of each of the plurality of program loops executed after the first program loop and before the second program loop, while applying the stepped-up program voltage to the first word line, the controller applies the second voltage to each of the third and fourth bit lines.

5. The semiconductor memory device of claim 1, wherein, in each of the program loops, the controller applies a third voltage higher than the first and second voltages to the first bit line when the verification of the first memory cell transistor has been passed, applies the third voltage to the second bit line when the verification of the second memory cell transistor has been passed, applies the third voltage to the third bit line when the verification of the third memory cell transistor has been passed, and applies the third voltage to the fourth bit line when the verification of the fourth memory cell transistor has been passed.

6. The semiconductor memory device of claim 5, wherein the first verify voltage is a verify voltage for the first data.

7. The semiconductor memory device of claim 5, wherein the second verify voltage is a verify voltage for the second data.

8. The semiconductor memory device of claim 1, wherein the second program loop is an N-th (where N is an integer larger than or equal to 1) program loop.

9. The semiconductor memory device of claim 1, further comprising:
fifth and sixth memory cell transistors coupled to the first word line;
a fifth bit line coupled to the fifth memory cell transistor; and
a sixth bit line coupled to the sixth memory cell transistor, wherein:
the program loops further include a third program loop after the second program loop,
in the write operation, the controller causes each of the fifth and sixth memory cell transistors to store third data different from the first and second data,
in the program operations after the first program loop and before the second program loop, while applying the stepped-up program voltage to the first word line, the controller applies one of the first voltage or the second voltage to each of the third to sixth bit lines,
in the program operations after the second program loop and before the third program loop, while applying the stepped-up program voltage to the first word line, the controller applies one of the first voltage or the second voltage to each of the fifth and sixth bit lines,
in the program operation of the third program loop, while applying a stepped-up program voltage to the first word line, the controller applies the first voltage to each of the fifth and sixth bit lines,
in the verify operation of the third program loop, the controller classifies the fifth and sixth memory cell transistors respectively into a fifth group of memory cell transistors each having a low threshold voltage and a sixth group of memory cell transistors each having a high threshold voltage, the verify operation of the third program loop being executed by applying a third verify voltage higher than the second verify voltage to the first word line, and
in the program operation of each of a plurality of program loops executed after the third program loop, while applying a stepped-up program voltage to the first word line, the controller applies the first voltage to the fifth bit line when a verification of the fifth memory cell transistor classified into the fifth group has not been passed, and applies the second voltage to the sixth bit line when a verification of the sixth memory cell transistor classified into the sixth group has not been passed.

10. The semiconductor memory device of claim 9, wherein the second voltage is higher than the first voltage.

11. The semiconductor memory device of claim 10, wherein:
in the program operations after the first program loop and before the second program loop, while applying the stepped-up program voltage to the first word line, the controller applies the first voltage to each of the third to sixth bit lines, and
in the program operations after the second program loop and before the third program loop, while applying the stepped-up program voltage to the first word line, the controller applies the first voltage to each of the fifth and sixth bit lines.

12. The semiconductor memory device of claim 10, wherein:
in the program operations after the first program loop and before the second program loop, while applying the stepped-up program voltage to the first word line, the controller applies the second voltage to each of the third to sixth bit lines, and
in the program operations after the second program loop and before the third program loop, while applying the stepped-up program voltage to the first word line, the controller applies the second voltage to each of the fifth and sixth bit lines.

13. The semiconductor memory device of claim 9, wherein, in each of the program loops, the controller applies a third voltage higher than the first voltage and second voltage to the first bit line when the verification of the first memory cell transistor has been passed, applies the third voltage to the second bit line when the verification of the second memory cell transistor has been passed, applies the third voltage to the third bit line when the verification of the third memory cell transistor has been passed, applies the third voltage to the fourth bit line when the verification of the fourth memory cell transistor has been passed, applies the third voltage to the fifth bit line when the verification of the fifth memory cell transistor has been passed, and applies the third voltage to the sixth bit line when the verification of the sixth memory cell transistor has been passed.

14. The semiconductor memory of claim 9, wherein the third verify voltage is a verify voltage for the third data.

15. The semiconductor memory of claim 9, wherein:
the second program loop is an N-th (where N is an integer larger than or equal to 1) program loop, and
the third program loop is an M-th (where M is an integer larger than N) program loop.

16. A semiconductor memory device comprising:
first to fourth memory cell transistors;
a first word line coupled to the first to fourth memory cell transistors;
a first bit line coupled to the first memory cell transistor;
a second bit line coupled to the second memory cell transistor;
a third bit line coupled to the third memory cell transistor;
a fourth bit line coupled to the fourth memory cell transistor; and
a controller configured to:
- in a verify operation of a first program loop in a write operation that is executed by applying a first verify voltage to the first word line, determine that the first and second memory cell transistors are in a first state and second state, respectively;
- in a second program loop after the first program loop in the write operation:
  - in a program operation, apply a first voltage to the first bit line when a verification of the first memory cell transistor has not been passed, apply a second voltage different from the first voltage to the second bit line when a verification of the second memory cell transistor has not been passed, and apply one of the first voltage or the second voltage to each of the third bit line and the fourth bit line, and
  - in a verify operation, refrain from using the first verify voltage;
- in a verify operation of a third program loop after the second program loop in a write operation that is executed by applying a second verify voltage higher than the first verify voltage to the first word line, determine that the third and fourth memory cell transistors are in a third state and fourth state, respectively; and
- in a fourth program loop after the third program loop in the write operation:
  - in a program operation, apply the first voltage to the third bit line when a verification of the third memory cell transistor has not been passed, and apply the second voltage to the fourth bit line when a verification of the fourth memory cell transistor has not been passed, and
  - in a verify operation, refrain from using the first and second verify voltages.

17. The semiconductor memory device of claim 16, wherein the second voltage is higher than the first voltage.

18. The semiconductor memory device of claim 16, wherein in the program operation of the first program loop, the controller applies the first voltage to each of the first to fourth bit lines.

19. The semiconductor memory device of claim 16, wherein:
the first state is a state in which the first memory cell transistor has a threshold voltage lower than the first verify voltage, and
the second state is a state in which the second memory cell transistor has a threshold voltage higher than or equal to the first verify voltage.

20. The semiconductor memory device of claim 19, wherein:
the third state is a state in which the third memory cell transistor has a threshold voltage lower than the second verify voltage, and
the fourth state is a state in which the fourth memory cell transistor has a threshold voltage higher than or equal to the second verify voltage.

\* \* \* \* \*